(12) United States Patent
Ohkura

(10) Patent No.: US 8,378,688 B2
(45) Date of Patent: Feb. 19, 2013

(54) CAPACITY MAINTENANCE RATIO DETERMINATION DEVICE, BATTERY SYSTEM AND ELECTRIC VEHICLE

(75) Inventor: Kazumi Ohkura, Nara (JP)

(73) Assignee: SANYO Electric Co., Ltd., Moriguchi-Shi (JP)

( * ) Notice: Subject to any disclaimer, the term of this patent is extended or adjusted under 35 U.S.C. 154(b) by 372 days.

(21) Appl. No.: 12/851,038

(22) Filed: Aug. 5, 2010

(65) Prior Publication Data

US 2011/0031048 A1 Feb. 10, 2011

(30) Foreign Application Priority Data

Aug. 7, 2009 (JP) ................................. 2009-185237

(51) Int. Cl.
*G01N 27/416* (2006.01)
*B60K 1/00* (2006.01)

(52) U.S. Cl. ...................... 324/430; 180/65.1; 180/65.29

(58) Field of Classification Search .................. 324/430, 324/431, 432, 433; 180/65.1, 65.265, 65.27, 180/65.275, 68.2; 320/DIG. 22; 702/63
See application file for complete search history.

(56) References Cited

U.S. PATENT DOCUMENTS 7,136,762 B2 * 11/2006 Ono ................................ 702/63

| | | |
|---|---|---|
| 2010/0079002 A1 | 4/2010 | Kishimoto et al. |
| 2010/0096922 A1 | 4/2010 | Kishimoto |

FOREIGN PATENT DOCUMENTS

| | | |
|---|---|---|
| JP | 10082843 | 3/1998 |
| JP | 10232273 | 9/1998 |
| JP | 2003222660 | 8/2003 |
| JP | 2006226788 | 8/2006 |
| JP | 2010088159 | 4/2010 |
| JP | 2010104129 | 5/2010 |
| JP | 8179018 | 8/2010 |

* cited by examiner

*Primary Examiner* — J. Allen Shriver, II
*Assistant Examiner* — James Triggs
(74) *Attorney, Agent, or Firm* — NDQ&M Watchstone LLP

(57) ABSTRACT

A capacity maintenance ratio determination device includes an impedance measurement unit and a capacity estimation unit. An alternating signal is applied from a signal generator to a battery. Frequency characteristics of AC impedance are calculated by the impedance measurement unit based on a response signal output from the battery in response to the alternating signal. A feature frequency is determined from the calculated frequency characteristics. The capacity estimation unit includes a memory and a determination unit. A correspondence relationship among a temperature of the battery, the feature frequency and a capacity maintenance ratio is stored in the memory. The determination unit determines the capacity maintenance ratio of the battery based on the temperature of the battery detected by a temperature detector, the determined feature frequency and the correspondence relationship stored in the memory.

9 Claims, 19 Drawing Sheets

F I G. 5
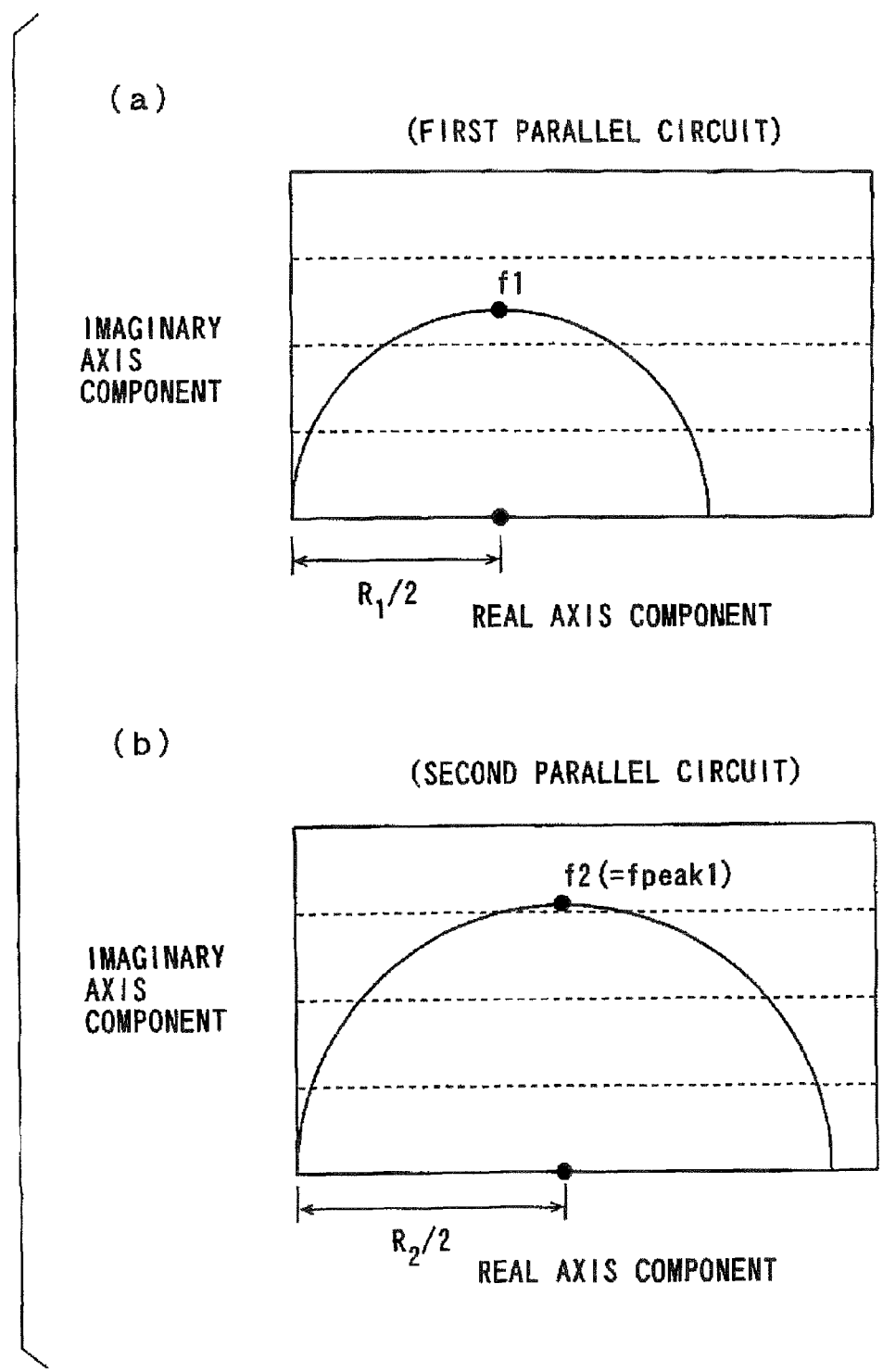

F I G. 6
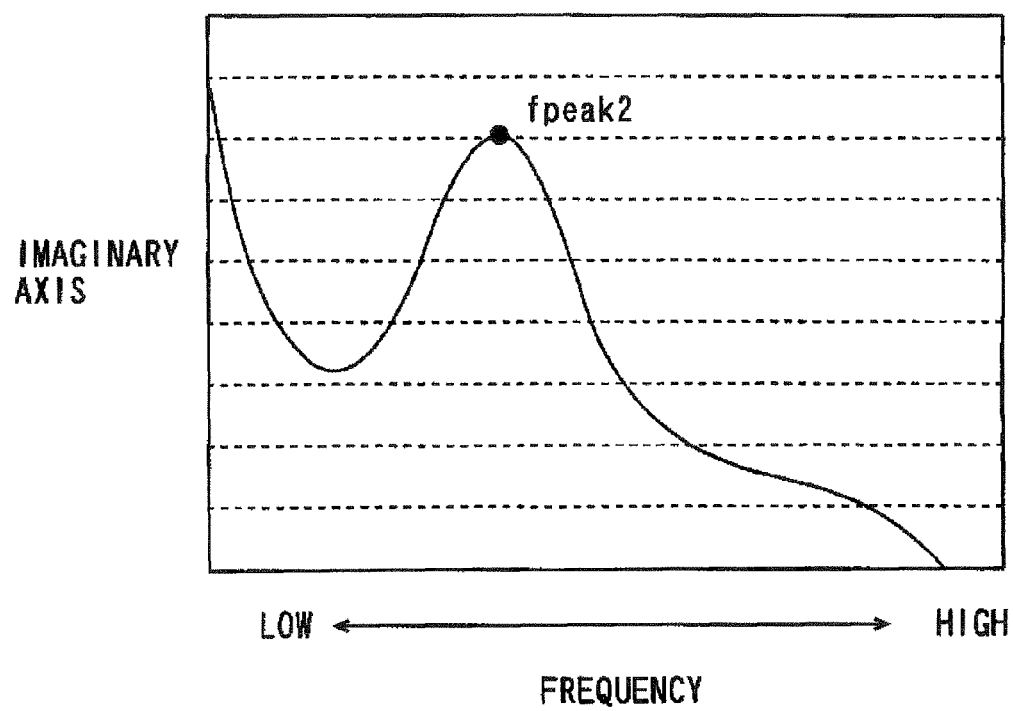

F I G. 7
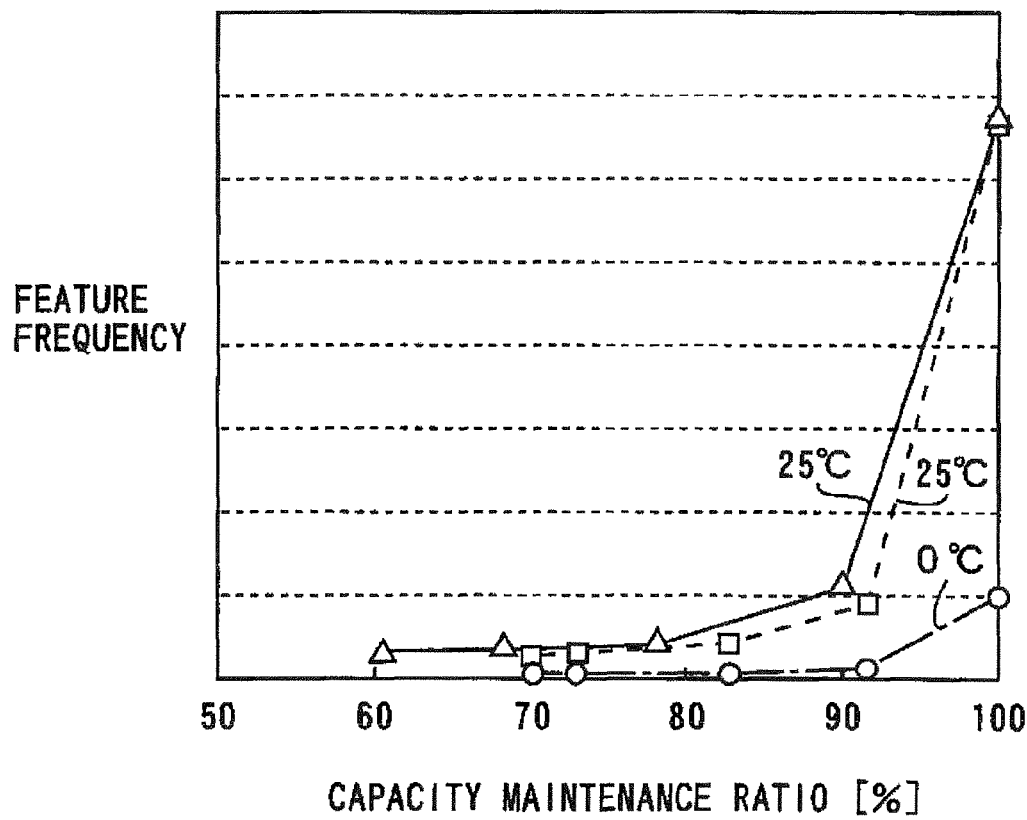

F I G. 1 2
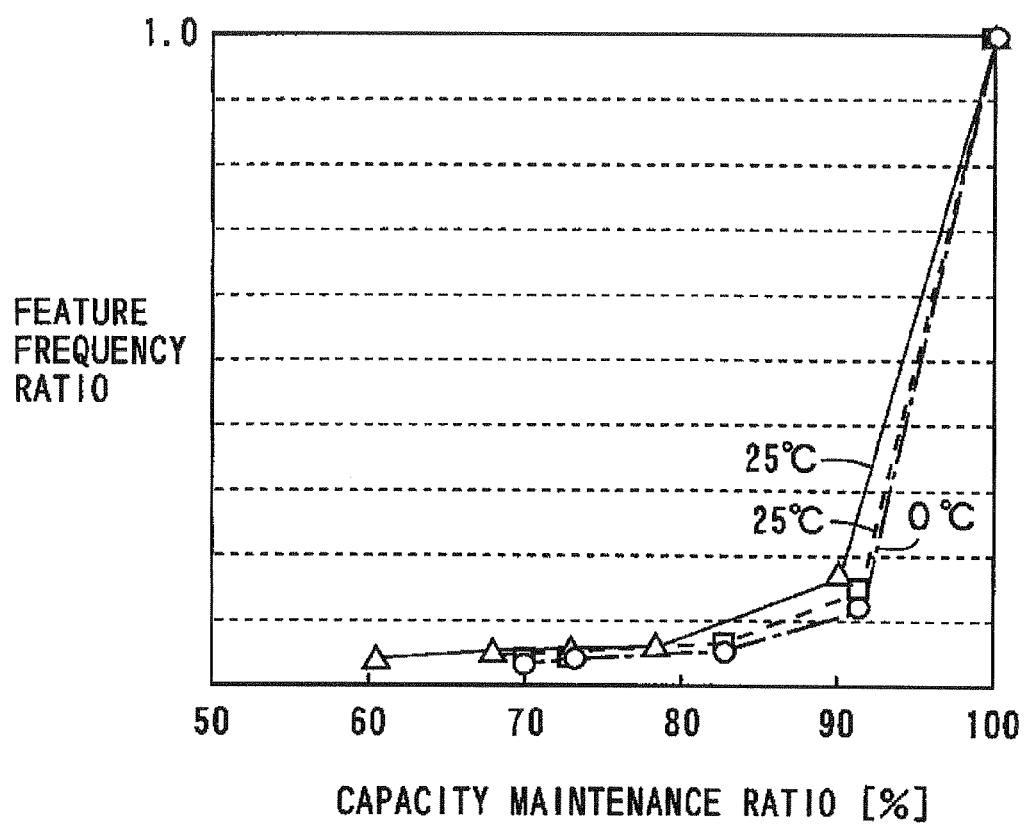

CAPACITY MAINTENANCE RATIO DETERMINATION DEVICE, BATTERY SYSTEM AND ELECTRIC VEHICLE

CROSS REFERENCE TO RELATED APPLICATIONS

This application claims priority to Japanese Patent App. No. 2009-185237, filed Aug. 7, 2009, which is incorporated herein by reference in its entirety.

BACKGROUND OF THE INVENTION

1. Field of the Invention

The present invention relates to a capacity maintenance ratio determination device of a chargeable and dischargeable battery, a battery system and an electric vehicle.

2. Description of the Background Art

Degradation of a chargeable and dischargeable battery leads to its lower full charge capacity than its initial (when shipped from a factory, for example) full charge capacity. This causes discharge duration of the battery in a full charge state to be shortened as the degradation of the battery proceeds.

A capacity maintenance ratio, which is a ratio of a present capacity of the battery to a reference capacity, is used as a value representing a degradation level of such a battery. A larger capacity maintenance ratio indicates less advanced degradation of the battery, and a smaller capacity maintenance ratio indicates more advanced degradation of the battery.

The full charge capacity needs to be found in order to obtain the capacity maintenance ratio. JP 8-179018 A describes a remaining capacity display device that calculates the full charge capacity as a total capacity.

In the remaining capacity display device, first, the battery is charged for a given period of time, and a current flowing through the battery during the given period of time is integrated, thereby calculating an integrated capacity (an amount of electric charges) charged in the battery in the give period of time. In addition, a battery voltage is detected before and after the given period of time, and an amount of change in the battery voltage before and after the given period of time is calculated.

Then, the calculated integrated capacity is divided by the amount of change in the battery voltage, and the division result is multiplied by a difference value between the battery voltage in a complete discharge state and the battery voltage in the full charge state. The difference value is previously found by experiments and so on. The multiplication result found in the foregoing manner is displayed as the total capacity, that is, the full charge capacity of the battery. As described above, the full charge capacity of the battery is calculated assuming that the foregoing integrated capacity is proportional to the amount of change in the battery voltage in the remaining capacity display device of JP 8-179018 A.

In an actual battery, however, the foregoing integrated capacity is not exactly proportional to the amount of change in the battery voltage. Therefore, the full charge capacity of the battery cannot be accurately obtained in the remaining capacity display device described in JP 8-179018 A.

One method is considered for accurately finding the full charge capacity of the battery. In the method, the battery is completely discharged and then charged to the full charge state, and the full charge capacity is calculated based on a current integrated value during the charge.

This method, however, requires a sufficient period of time for charging/discharging the battery. In addition, when power failure or the like is taken into consideration, a battery used in a backup power supply, an electric vehicle and so on cannot be completely discharged.

BRIEF SUMMARY OF THE INVENTION

An object of the present invention is to provide a capacity maintenance ratio determination device capable of accurately determining a capacity maintenance ratio in a short period of time without completely charging/discharging a battery, a battery system and an electric vehicle.

The inventor has discovered through experiments and examinations that there exists a constant correspondence relationship between a value of predetermined feature information in frequency characteristics of AC impedance of a battery and a capacity maintenance ratio of the battery. Therefore, the inventor has devised the present invention based on such a correspondence relationship.

(1) According to an aspect of the present invention, a capacity maintenance ratio determination device that determines a capacity maintenance ratio, which is a ratio of a present capacity to a reference capacity, of a chargeable and dischargeable battery based on a response signal output from the battery in response to an alternating signal having a plurality of frequency components applied from a signal generator and based on a temperature of the battery detected by a temperature detector includes an impedance calculator arranged to calculate frequency characteristics of AC impedance of the battery based on the response signal output from the battery, a storage arranged to store a relationship between a value of predetermined feature information about a frequency in the frequency characteristics of the AC impedance and the capacity maintenance ratio, and a determiner arranged to determine the value of the feature information in the frequency characteristics calculated by the impedance calculator, and determine the capacity maintenance ratio corresponding to the determined value of the feature information based on the relationship stored in the storage and the temperature detected by the temperature detector.

Since the capacity maintenance ratio is determined based on the response signal output from the battery in response to the alternating signal of the signal generator, the capacity maintenance ratio can be determined in a short period of time in the capacity maintenance ratio determination device without charging/discharging the battery.

The capacity maintenance ratio is determined based on the relationship between the value of the predetermined feature information in the frequency characteristics of the AC impedance and the capacity maintenance ratio, thus improving determination accuracy of the capacity maintenance ratio.

(2) The frequency characteristics of the AC impedance may be imaginary axis component-real axis component characteristics of complex impedance for each frequency, and when there is one maximal value of an imaginary axis component in the imaginary axis component-real axis component characteristics, the feature information may be a frequency corresponding to the one maximal value, and when there are two maximal values of the imaginary axis component in the imaginary axis component-real axis component characteristics, the feature information may be a frequency corresponding to a larger one of the two maximal values.

When there is the one maximal value of the imaginary axis component in the imaginary axis component-real axis component characteristics calculated by the AC impedance calculator, the frequency corresponding to the one maximal value is determined by the determiner as the value of the feature information. When there are the two maximal values of the imaginary axis component in the imaginary axis component-real axis component characteristics calculated by the AC impedance calculator, the frequency corresponding to the larger one of the two maximal values is determined by the determiner as the value of the feature information. Accordingly, the value of the feature information having the constant relationship with the capacity maintenance ratio can be easily determined. This allows the capacity maintenance ratio to be more easily determined.

(3) The battery may be represented by an equivalent circuit including one parallel circuit or an equivalent circuit including two parallel circuits connected in series, and each parallel circuit may include parallel connection of a capacitance component and a resistance component, the frequency characteristics of the AC impedance may be a relationship between a capacitance value and a resistance value for each frequency of the one or two parallel circuits obtained from imaginary axis component-real axis component characteristics of complex impedance for each frequency, and when the battery is represented by the equivalent circuit including the one parallel circuit, the feature information may be a frequency calculated based on a product of a capacitance value and a resistance value of the one parallel circuit, and when the battery is represented by the equivalent circuit including the two parallel circuits, the feature information may be a smaller one of frequencies calculated based on respective products of capacitance values and resistance values of the two parallel circuits.

In this case, the relationship between the capacitance value and the resistance value of the one or two parallel circuits obtained from the imaginary axis component-real axis component characteristics having the imaginary axis component and a real axis component of the complex impedance for each frequency is calculated by the AC impedance calculator as the frequency characteristics of the AC impedance.

When the battery is represented by the equivalent circuit including the one parallel circuit, the frequency calculated based on the product of the capacitance value and the resistance value of the one parallel circuit is determined by the determiner as the value of the feature information.

When the battery is represented by the equivalent circuit including the two parallel circuits, the smaller one of the frequencies calculated based on the respective products of the capacitance values and the resistance values of the two parallel circuits is determined by the determiner as the value of the feature information.

Accordingly, the value of the feature information having the constant relationship with the capacity maintenance ratio can be easily determined. This allows the capacity maintenance ratio to be more easily determined.

(4) The frequency characteristics of the AC impedance may be an imaginary axis component-frequency characteristics of complex impedance for each frequency, and when there is one maximal value of an imaginary axis component in the imaginary axis component-frequency characteristics, the feature information may be a frequency corresponding to the one maximal value, and when there are two maximal values of the imaginary axis component in the imaginary axis component-frequency characteristics, the feature information may be a frequency corresponding to a maximal value on a lower frequency side of the two maximal values.

In this case, the imaginary axis component-frequency characteristics having the imaginary axis component and a frequency component of the complex impedance for each frequency is calculated as the frequency characteristics of the AC impedance by the AC impedance calculator.

When there is the one maximal value of the imaginary axis component in the imaginary axis component-frequency characteristics, the frequency corresponding to the one maximal value is determined by the determiner as the value of the feature information. When there are the two maximal values of the imaginary axis component in the imaginary axis component-frequency characteristics, the frequency corresponding to the maximal value, which is on the lower frequency side, of the two maximal values is determined by the determiner as the value of the feature information. Accordingly, the value of the feature information having the constant relationship with the capacity maintenance ratio can be easily determined. This allows the capacity maintenance ratio to be more easily determined.

(5) The storage may be arranged to store a correspondence relationship among the temperature of the battery, the value of the feature information and the capacity maintenance ratio, and the determiner may be arranged to determine the capacity maintenance ratio corresponding to the temperature detected by the temperature detector and the determined value of the feature information using the correspondence relationship stored in the storage.

In this case, the correspondence relationship among the temperature of the battery, the value of the feature information and the capacity maintenance ratio is stored in the storage. In the determiner, the capacity maintenance ratio corresponding to the temperature detected by the temperature detector and the determined value of the feature information is determined using the correspondence relationship stored in the storage. This allows the capacity maintenance ratio to be accurately determined.

(6) When a value of the feature information in a reference capacity maintenance ratio is a reference feature information value and a ratio of each value of the feature information to the reference feature information value is a feature information ratio, the storage may be arranged to store a correspondence relationship between the temperature of the battery and the reference feature information value as a first correspondence relationship, and store a correspondence relationship between the feature information ratio and the capacity maintenance ratio as a second correspondence relationship, and the determiner may be arranged to find the reference feature information value corresponding to the temperature detected by the temperature detector using the first correspondence relationship stored in the storage, find the feature information ratio from the determined value of the feature information and the found reference feature information value, and determine the capacity maintenance ratio corresponding to the found feature information ratio using the second correspondence relationship.

In this case, the correspondence relationship between the temperature of the battery and the reference feature information value is stored as the first correspondence relationship, and the correspondence relationship between the feature information ratio and the capacity maintenance ratio is stored as the second correspondence relationship in the storage. In the determiner, the reference feature information value corresponding to the temperature detected by the temperature detector is obtained using the first correspondence relationship, and the feature information ratio is obtained from the determined value of the feature information and the obtained reference feature information value. Then, the capacity maintenance ratio corresponding to the obtained feature information ratio is determined using the second correspondence relationship. This allows the capacity maintenance ratio to be accurately determined.

Here, the amount of information included in the first and second correspondence relationships is smaller than the amount of information included in the correspondence relationship among the temperature of the battery, the value of the feature information and the capacity maintenance ratio. Therefore, storage capacity in the storage required for storing the first and second correspondence relationships is reduced.

(7) When a value of the feature information in a reference temperature of the battery and a reference capacity maintenance ratio is a reference feature information value and a ratio of each value of the feature information to the reference feature information value is a feature information ratio, the storage may be arranged to store the reference feature information value and store a correspondence relationship between the feature information ratio and the capacity maintenance ratio, and the determiner may be arranged to correct the reference feature information value stored in the storage based on the temperature detected by the temperature detector, find the feature information ratio from the determined value of the feature information and the corrected reference feature information value, and determine the capacity maintenance ratio corresponding to the found feature information ratio using the correspondence relationship stored in the storage.

In this case, the correspondence relationship between the feature information ratio and the capacity maintenance ratio is stored in the storage together with the reference feature information value. In the determiner, the reference feature information value stored in the storage is corrected based on the temperature detected by the temperature detector, and the feature information ratio is obtained from the determined value of the feature information and the corrected reference feature information value. Then, the capacity maintenance ratio corresponding to the obtained feature information ratio is determined using the correspondence relationship stored in the storage. This allows the capacity maintenance ratio to be accurately determined.

Here, the amount of information included in the correspondence relationship between the feature information ratio and the capacity maintenance ratio is sufficiently smaller than the amount of information included in the correspondence relationship among the temperature of the battery, the value of the feature information and the capacity maintenance ratio. Therefore, the storage capacity of the storage required for storing the correspondence relationship is sufficiently reduced.

(8) According to another aspect of the present invention, a battery system includes a chargeable and dischargeable battery, a signal generator arranged to apply an alternating signal having a plurality of frequency components to the battery, an impedance calculator arranged to calculate frequency characteristics of AC impedance based on a response signal output from the battery in response to the alternating signal, a storage arranged to store a relationship between a value of predetermined feature information about a frequency in the frequency characteristics of the AC impedance and a capacity maintenance ratio, a temperature detector arranged to detect a temperature of the battery, a determiner arranged to determine the value of the feature information in the frequency characteristics calculated by the impedance calculator, and determine the capacity maintenance ratio corresponding to the determined value of the feature information based on the relationship stored in the storage and the temperature detected by the temperature detector, and a communicator for communicating information about the capacity maintenance ratio determined by the determiner.

Since the capacity maintenance ratio is determined based on the response signal output from the battery in response to the alternating signal of the signal generator, the capacity maintenance ratio can be determined in a short period of time without charging/discharging the battery in the battery system.

The capacity maintenance ratio is determined based on the relationship between the value of the predetermined feature information in the frequency characteristics of the AC impedance and the capacity maintenance ratio, thus improving determination accuracy of the capacity maintenance ratio.

The battery system includes the communicator, thus allowing the information about the capacity maintenance ratio to be easily communicated between the battery system and external equipment.

(9) According to still another aspect of the present invention, an electric vehicle includes the battery system according to the another aspect of the present invention, a motor driven by electric power supplied from the battery of the battery system, a drive wheel rotated by torque of the motor; and an output apparatus arranged to output the information about the capacity maintenance ratio determined by the determiner of the battery system.

In the electric vehicle, since the capacity maintenance ratio is determined based on the response signal output from the battery in response to the alternating signal of the signal generator, the capacity maintenance ratio can be determined in a short period of time without charging/discharging the battery.

The capacity maintenance ratio is determined based on the relationship between the value of the predetermined feature information in the frequency characteristics of the AC impedance and the capacity maintenance ratio, thus improving determination accuracy of the capacity maintenance ratio.

The information about the capacity maintenance ratio is easily communicated by the communicator. The information about the capacity maintenance ratio determined by the determiner is output from the output apparatus. Accordingly, a user of the electric vehicle can easily recognize the capacity maintenance ratio of the battery based on the information output from the output apparatus.

Other features, elements, characteristics, and advantages of the present invention will become more apparent from the following description of preferred embodiments of the present invention with reference to the attached drawings.

BRIEF DESCRIPTION OF THE SEVERAL VIEWS OF THE DRAWINGS

FIG. 5 is a diagram showing one example of a capacitive semicircle found based on the imaginary axis component-real axis component characteristics of the complex impedance of each of the first and second parallel circuits.

FIG. 6 is a diagram representing an imaginary axis component-frequency characteristics of the complex impedance of the battery.

FIG. 7 is a diagram showing temperature dependence of a relationship between a feature frequency and a capacity maintenance ratio of the battery.

FIG. 12 is a diagram showing a relationship between a feature frequency ratio and the capacity maintenance ratio.

DETAILED DESCRIPTION OF THE INVENTION

Figure 1:
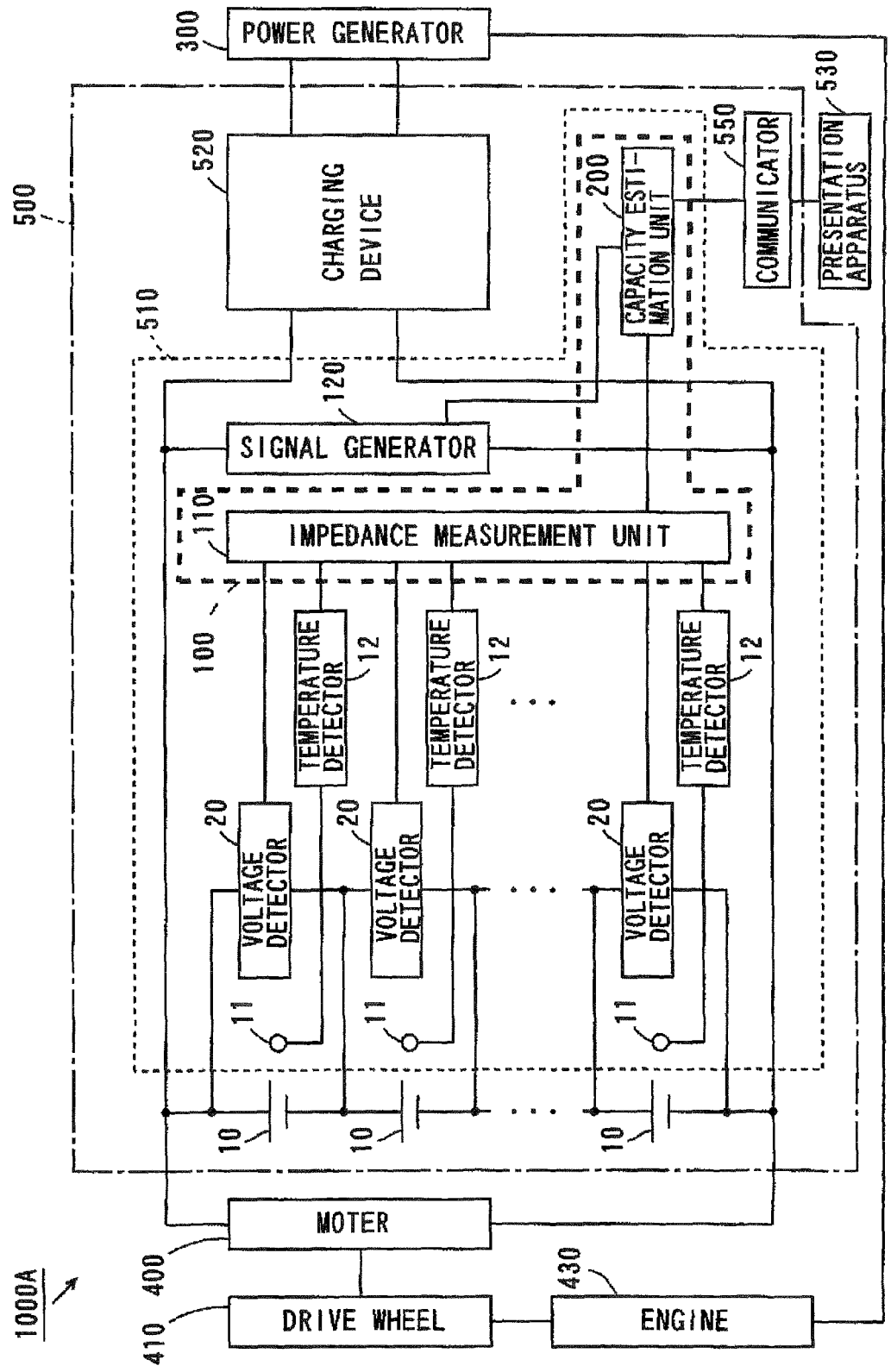
FIG. 1 is a block diagram showing the configuration of an electric vehicle according to one embodiment of the present invention.

Description will be made of a capacity maintenance ratio determination device, a battery system and an electric vehicle according to one embodiment of the present invention while referring to the drawings. Examples of the electric vehicle include a hybrid electric vehicle, a battery electric vehicle, and a plug-in hybrid electric vehicle.

In the following description, an amount of electric charges stored in a battery in a full charge state is referred to as a full charge capacity. An amount of electric charges stored in the battery in a given state is referred to as a remaining capacity.

A capacity maintenance ratio refers to a ratio of the full charge capacity in an n-th charge/discharge cycle to the full charge capacity in an initial charge/discharge cycle. When the initial charge/discharge cycle is the first charge/discharge cycle, n is a natural number of not less than two. In this case, a larger capacity maintenance ratio indicates less advanced degradation of the battery, and a smaller capacity maintenance ratio indicates more advanced degradation of the battery.

Here, the initial charge/discharge cycle means a charge/discharge cycle at a predetermined timing. The initial charge/discharge cycle may be the first charge/discharge cycle immediately after the battery 10 is manufactured, or may be the first charge/discharge cycle after shipment from a factory, for example.

A ratio of the remaining capacity to the full charge capacity of the battery is referred to as a state of charge (hereinafter abbreviated as an SOC).

(1) Configuration of the Electric Vehicle

FIG. 1 is a block diagram showing the configuration of an electric vehicle according to an embodiment of the present invention. The electric vehicle according to the present embodiment is a hybrid electric vehicle.

As shown in FIG. 1, the electric vehicle 1000A includes a power generator 300, a motor 400, a drive wheel 410, an engine 430, a battery system 500 and a presentation apparatus 530.

The motor 400 and the engine 430 are each connected to the drive wheel 410, and function as power sources of the electric vehicle 1000A. The power generator 300 is connected to the engine 430. Part of torque generated in the engine 430 is transmitted to the power generator 300 during driving of the electric vehicle 1000A. This causes electric power to be generated in the power generator 300.

The presentation apparatus 530 is composed of a display device including a liquid crystal display panel and so on, or an audio output device such as a speaker, or combination thereof.

The battery system 500 includes a plurality of batteries 10, a capacity maintenance ratio determination apparatus 510, a charging device 520 and a communicator 550. The plurality of batteries 10 are connected in series, and connected to the motor 400 as a load while being connected to the charging device 520 through the capacity maintenance ratio determination apparatus 510. Each battery 10 is a chargeable and dischargeable lithium-ion battery or a chargeable and dischargeable nickel metal hydride battery, for example.

The charging device 520 is connected to the plurality of batteries 10 and the power generator 300. The charging device 520 converts the electric power generated in the power generator 300 into electric power suitable for charging the plurality of batteries 10, and supplies the electric power to the plurality of batteries 10. This causes the plurality of batteries 10 to be charged.

The capacity maintenance ratio determination apparatus 510 includes a plurality of thermistors 11, a plurality of temperature detectors 12, a plurality of voltage detectors 20, a capacity maintenance ratio determination device 100 and a signal generator 120. The capacity maintenance ratio determination device 100 includes an impedance measurement unit 110 and a capacity estimation unit 200. The plurality of thermistors 11, the plurality of temperature detectors 12 and the plurality of voltage detectors 20 are provided corresponding to the plurality of batteries 10, respectively.

The signal generator 120 is provided in common with respect to the plurality of batteries 10 connected in series. The signal generator 120 applies an alternating signal having a plurality of frequency components to the plurality of batteries 10 in order to calculate frequency characteristics of AC impedance of the plurality of batteries 10. In the present embodiment, the alternating signal is an alternating current. In this case, each battery 10 that has received the alternating signal outputs a response signal. In the present embodiment, the response signal is an alternating voltage.

The alternating signal having the plurality of frequency components include white noise, for example. When the alternating signal having the plurality of frequency components is the white noise, the alternating signal having the plurality of frequency components can be applied to the battery 10 by applying the white noise to the battery 10.

When the alternating signal is not the white noise, the alternating signal is applied to the battery 10 while the frequency of the alternating signal is changed, for example, so that the alternating signal having the plurality of frequency components can be applied to the battery 10.

The signal generator 120 is not necessarily provided in the present embodiment. The reason is described below.

As described above, the plurality of batteries 10 are connected to the motor 400 while being connected to the power generator 300 through the charging device 520. In this state, a current including a plurality of frequency components flows from the motor 400 or the power generator 300 to the plurality of batteries 10. Thus, even though the signal generator 120 is not provided, the AC impedance of the plurality of batteries 10, described below, can be calculated by using, for example, the current including the plurality of frequency components that flows from the motor 400 or the power generator 300 to the plurality of batteries 10 as the foregoing alternating signal. In this case, the motor 400 or the power generator 300, for example, functions as a signal generator of the claims.

Each voltage detector 20 detects a voltage value of the response signal output from the corresponding battery 10. The voltage detector 20 detects an open circuit voltage of the corresponding battery 10.

Each thermistor 11 is provided in proximity to the corresponding battery 10, and connected to the corresponding temperature detector 12. Each temperature detector 12 detects the temperature of the corresponding battery 10 based on an output signal of the corresponding thermistor 11.

The capacity maintenance ratio determination device 100 determines a capacity maintenance ratio of the plurality of batteries 10 based on the response signal output from the plurality of batteries 10 in response to the alternating signal having the plurality of frequency components applied from the signal generator 120 and the temperature of the plurality of batteries 10 detected by the plurality of temperature detectors 12.

More specifically, the impedance measurement unit 110 calculates the frequency characteristics of the AC impedance of the plurality of batteries 10 based on the alternating signal generated by the signal generator 120 and the response signal detected by the plurality of voltage detectors 20 in the capacity maintenance ratio determination device 100.

The capacity estimation unit 200 includes a frequency determination unit 210, a capacity maintenance ratio determination unit 220 and a memory 230 (see FIG. 9) as described below. The capacity maintenance ratio determination unit 220 is composed of a CPU (Central Processing Unit), for example. The capacity maintenance ratio determination unit 220 operates the signal generator 120 at given timings.

In the capacity maintenance ratio determination device 100, the capacity maintenance ratio determination unit 220 determines the capacity maintenance ratio of each battery 10 based on the frequency characteristics of the AC impedance calculated by the impedance measurement unit 110, the open circuit voltage detected by each voltage detector 20 and the temperature detected by each temperature detector 12.

The communicator 550 includes one or a plurality of connectors, a chip set and so on used for communication between the battery system 500 and the exterior, for example.

In this example, the presentation apparatus 530 is connected to the communicator 550. Information about the capacity maintenance ratio of each battery 10 determined by the capacity maintenance ratio determination unit 220 is output from the communicator 550. This causes the information about the capacity maintenance ratio to be transmitted to the presentation apparatus 530 through the communicator 550.

The presentation apparatus 530 is the display device or the audio output device provided in a control panel of the electric vehicle 1000A, and presents the information about the capacity maintenance ratio of the plurality of batteries 10 determined by the capacity maintenance ratio determination unit 220 to a user (driver) of the electric vehicle 1000A using images, sounds or characters. In this case, the presentation apparatus 530 functions as an output apparatus of the information about the capacity maintenance ratio in the claims.

The communicator 550 may be connectable by wired or wireless connection to a communication terminal or the like that is used by a maintenance worker of the electric vehicle 1000A carrying out a diagnosis of a state (a state of remaining life and so on) of the plurality of batteries 10, for example. The communication terminal is connected to the communicator 550, thereby causing the information about the capacity maintenance ratio of the plurality of batteries 10 determined by the capacity maintenance ratio determination unit 220 to be transmitted to the communication terminal. In this manner, the worker can carry out the diagnosis of the state of the plurality of batteries 10 using the communication terminal. In this case, the communicator 550 functions as an output apparatus of the information about the capacity maintenance ratio in the claims.

The battery system 500 may have another communicator for communicating the information about the capacity maintenance ratio of the plurality of batteries 10 between the electric vehicle 1000A and the exterior. The another communicator is connected to the communicator 550 through a wired or wireless local area network in the electric vehicle 1000A. In this manner, the information about the capacity maintenance ratio of the plurality of batteries 10 determined by the capacity maintenance ratio determination unit 220 can be transmitted to another component of the battery system 500 or the exterior of the electric vehicle 1000A through the another communicator. In this case, the another communicator functions as an output apparatus of the information about the capacity maintenance ratio in the claims.

When the electric vehicle of the claims is a plug-in hybrid electric vehicle or the like, described below, which is charged through a household outlet or the like, the another communicator may be connected to the communicator 550 through power line communication in the electric vehicle.

The information about the capacity maintenance ratio may be the capacity maintenance ratio of the plurality of batteries 10, remaining life of the plurality of batteries 10, or a message indicating an exchange timing of the batteries 10, for example.

(2) Feature Frequency

The inventor has discovered through experiments and examinations that there exists a constant relationship between a value of the frequency having a given feature in the frequency characteristics of the AC impedance of the battery 10 (hereinafter referred to as a feature frequency) and the capacity maintenance ratio of the battery 10. The capacity maintenance ratio determination unit 220 determines the feature frequency from the frequency characteristics of the AC impedance calculated by the impedance measurement unit 110 in the following manner, and determines the capacity maintenance ratio of the battery 10 using the determined feature frequency.

The alternating signal having the plurality of frequency components is applied to the battery 10. This allows the frequency characteristics of the AC impedance of the battery 10 to be calculated based on the response signal output from the battery 10 in response to the alternating signal. In the present embodiment, the alternating signal is the alternating current, and the response signal is the alternating voltage. Thus, the AC impedance is calculated by dividing the alternating voltage by the alternating current. The alternating signal may be an alternating voltage, and the response signal may be an alternating current.

(2-a) First Feature Frequency Determination Method

The first feature frequency determination method uses an imaginary axis component-real axis component characteristics of complex impedance as the frequency characteristics of the AC impedance.

Figure 2:
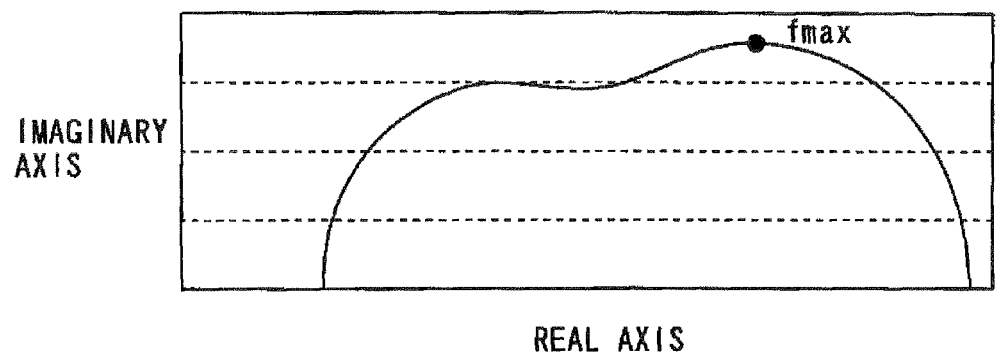
FIG. 2 is a diagram representing an imaginary axis component-real axis component characteristics of complex impedance of a battery.

FIG. 2 is a diagram representing the imaginary axis component-real axis component characteristics of the complex impedance of the battery 10. In FIG. 2, the ordinate indicates the imaginary axis component, and the abscissa indicates the real axis component. The imaginary axis component-real axis component characteristics of FIG. 2 is obtained by plotting (Cole-Cole plotting) the complex impedance in each frequency on a complex plane.

Two maximal values of the imaginary axis component appear in the imaginary axis component-real axis component characteristics of FIG. 2. In this case, a frequency corresponding to a larger one of the two maximal values is taken as a feature frequency fmax. When only one maximal value of the imaginary axis component appears in the imaginary axis component-real axis component characteristics, the frequency corresponding to the one maximal value is taken as the feature frequency fmax.

While the imaginary axis component-real axis component characteristics are represented by a curve in FIG. 2, the imaginary axis component-real axis component characteristics are actually represented by discrete data. Therefore, the feature frequency fmax is determined based on the curve obtained by interpolating the discrete data, for example. When a sufficient number of discrete data is obtained, the feature frequency fmax may be determined by extracting data at which the value of the imaginary axis component is maximized.

According to the experiments carried out by the inventor, the feature frequency fmax has the constant relationship with the capacity maintenance ratio. Thus, the capacity maintenance ratio can be determined by finding the feature frequency fmax.

(2-b) Second Feature Frequency Determination Method

Figure 3:
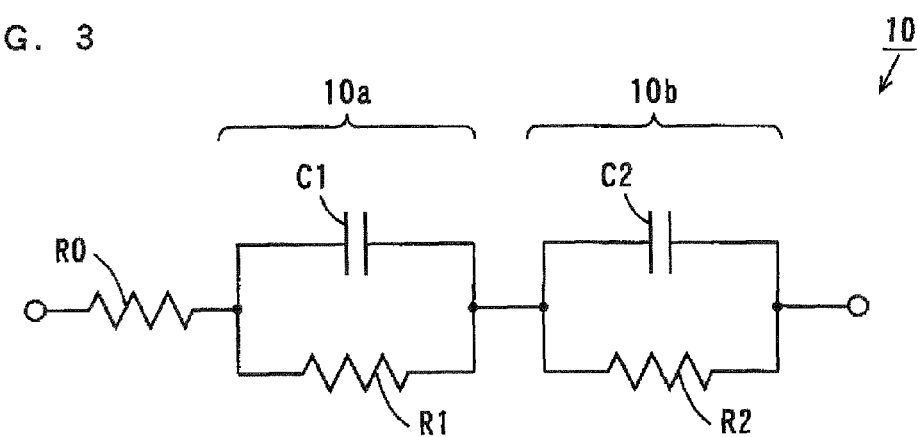
FIG. 3 is a diagram of an equivalent circuit of the battery through which a small alternating signal flows.

FIG. 3 is a diagram of an equivalent circuit of the battery 10 through which the small alternating signal flows. The equivalent circuit of FIG. 3 includes a resistance component R0, a first parallel circuit 10a and a second parallel circuit 10b connected in series. The first parallel circuit 10a includes parallel connection of a capacitance component C1 and a resistance component R1, and the second parallel circuit 10b includes parallel connection of a capacitance component C2 and a resistance component R2.

Figure 4:
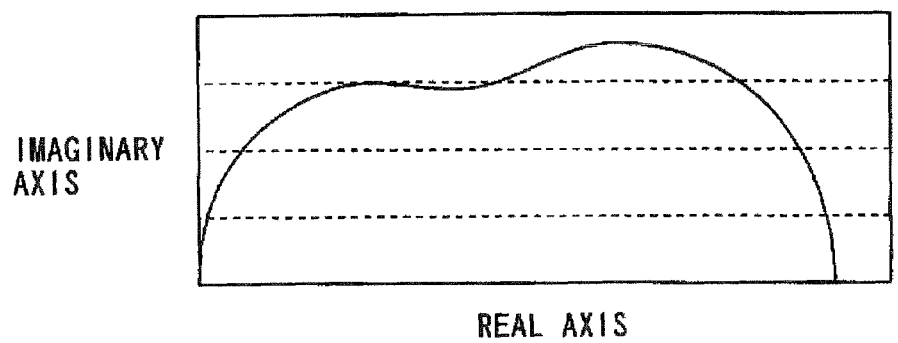
FIG. 4 is a diagram representing an imaginary axis component-real axis component characteristics of the complex impedance when a pure resistance component of the battery is ignored.

FIG. 4 is a diagram representing an imaginary axis component-real axis component characteristics of the complex impedance when a pure resistance component of the battery 10 is ignored. In the imaginary axis component-real axis component characteristics of FIG. 4, the imaginary axis component-real axis component characteristics of FIG. 2 are offset by the pure resistance component. While the imaginary axis component-real axis component characteristics of the complex impedance of the battery 10 are represented by a curve in FIG. 4, the characteristics are actually represented by discrete data.

Here, in the second feature frequency determination method, the imaginary axis component-real axis component characteristics of FIG. 4 are considered as synthetic impedance of complex impedance of the first parallel circuit 10a and complex impedance of the second parallel circuit 10b in the equivalent circuit of FIG. 3.

A value $R_1$ and a value $C_1$ of the resistance component R1 and the capacitance component C1, respectively, which constitute the first parallel circuit 10a, and a value $R_2$ and a value $C_2$ of the resistance component R2 and the capacitance component C2, respectively, which constitute the second parallel circuit 10b are obtained from measurement data of the synthetic impedance by a nonlinear least squares method, for example.

FIG. 5 (a) is a diagram showing one example of a capacitive semicircle found based on the value $R_1$ of the resistance component R1 and the value $C_1$ of the capacitance component C1 of the first parallel circuit 10a obtained from the measurement data of the synthetic impedance. In FIG. 5 (a), the ordinate indicates the imaginary axis component, and the abscissa indicates the real axis component. In FIG. 5 (a), the radius of the capacitive semicircle is represented by a half value of the value $R_1$ of the resistance component R1.

A frequency f1 at the peak of the capacitive semicircle can be calculated from the obtained value $C_1$ and value $R_1$ of the capacitance component C1 and the resistance component R1 based on the following equation.

$$f1=1/(2\pi R_1 C_1)$$

FIG. 5 (b) is a diagram showing one example of a capacitive semicircle found based on the value $R_2$ of the resistance component R2 and the value $C_2$ of the capacitance component C2 of the second parallel circuit 10b obtained from the measurement data of the synthetic impedance. In FIG. 5 (b), the ordinate indicates the imaginary axis component, and the abscissa indicates the real axis component. In FIG. 5 (b), the radius of the capacitive semicircle is represented by a half value of the value $R_2$ of the resistance component R2.

A frequency f2 at the peak of the capacitive semicircle can be calculated from the obtained value $C_2$ and value $R_2$ of the capacitance component C2 and the resistance component R2 based on the following equation.

$$f2=1/(2\pi R_2 C_2)$$

A lower one, which is f2, of the frequencies f1, f2 calculated in the foregoing manner is determined as a feature frequency fpeak1. In this case, the frequency (the frequency f2 in this example), which is calculated based on a larger value of $R_1 C_1$, which is the product of the value $C_1$ of the capacitance component C1 and the value $R_1$ of the resistance component R1 of the first parallel circuit 10a, and $R_2 C_2$, which is the product of the value $C_2$ of the capacitance component C2 and the value $R_2$ of the resistance component R2 of the second parallel circuit 10b, is determined as the feature frequency fpeak1.

While the equivalent circuit of the battery 10 through which the small alternating signal flows includes the first and second parallel circuits 10a, 10b in this example, the equivalent circuit of the battery 10 may include one parallel circuit. In this case, a frequency f3 that is calculated by the following equation based on $R_3 C_3$ that is a product of a value $C_3$ of a capacitance component and a value $R_3$ of a resistance component of the parallel circuit is the feature frequency fpeak1.

$$f3 = \frac{1}{2}\pi R_3 C_3$$

According to the experiments carried out by the inventor, the feature frequency fpeak1 also has a constant relationship with the capacity maintenance ratio. Thus, the capacity maintenance ratio can be determined by finding the feature frequency fpeak1.

The feature frequency fpeak1 determined using the second feature frequency determination method is slightly different from the feature frequency fmax determined using the first feature frequency determination method.

(2-c) Third Feature Frequency Determination Method

The third feature frequency determination method uses an imaginary axis component-frequency characteristics of the complex impedance as the frequency characteristics of the AC impedance.

FIG. 6 is a diagram representing the imaginary axis component-frequency characteristics of the complex impedance of the battery 10. In FIG. 6, the ordinate indicates the imaginary axis component, and the abscissa indicates the frequency.

One maximal value of the imaginary axis component appears in the imaginary axis component-frequency characteristics of FIG. 6. When only one maximal value of the imaginary axis component appears in the imaginary axis component-frequency characteristics, a frequency corresponding to the one maximal value is taken as the feature frequency fpeak2. When two maximal values of the imaginary axis component appear, a frequency of the maximal value that appears on a lower frequency side of the two maximal values is taken as a feature frequency fpeak2.

While the imaginary axis component-frequency characteristics of the complex impedance are represented by a curve in FIG. 6, the imaginary axis component-frequency characteristics are actually represented by discrete data. Accordingly, the feature frequency fpeak2 is determined based on the curve obtained by interpolating the discrete data, for example. When a sufficient number of data is obtained, the feature frequency fpeak2 may be determined by extracting data at which the value of the imaginary axis component is maximized.

According to the experiments carried out by the inventor, the feature frequency fpeak2 also has a constant relationship with the capacity maintenance ratio. Thus, the capacity maintenance ratio can be determined by finding the feature frequency fpeak2.

The feature frequency fpeak2 determined using the third feature frequency determination method is equal to the feature frequency fmax determined using the first feature frequency determination method.

(3) Temperature of the Battery

The relationship between the feature frequency and the capacity maintenance ratio varies depending on the temperature of the battery 10.

FIG. 7 is a diagram showing temperature dependence of the relationship between the feature frequency and the capacity maintenance ratio of the battery 10.

In FIG. 7, the ordinate indicates the feature frequency, and the abscissa indicates the capacity maintenance ratio. The squares and triangles indicate the relationship between the feature frequency and the capacity maintenance ratio when the temperature of the battery 10 is 25° C., and the circles indicate the relationship between the feature frequency and the capacity maintenance ratio when the temperature of the battery is 0° C. The relationships indicated by the squares and the circles are measured using the same battery 10, and the relationship indicated by the triangles is measured using a different battery 10 of the same type.

As shown in FIG. 7, the feature frequency corresponding to each capacity maintenance ratio when the temperature of the battery 10 is 25° C. is larger than that when the temperature of the battery 10 is 0° C.

As described above, the different temperatures of the battery 10 cause the different relationships between the feature frequency and the capacity maintenance ratio. Therefore, the determination of the capacity maintenance ratio based on the feature frequency needs to be made in a state of the same temperature of the battery 10 or in consideration of the temperature of the battery 10.

In the capacity maintenance ratio determination device 100 according to the present embodiment, the capacity maintenance ratio is determined based on the determined feature frequency in consideration of the temperature of the battery 10. Details will be described below.

Comparison of the relationships indicated by the squares and the triangles shows that the equal temperature leads to substantially the equal relationship even in the different battery 10. That is, the relationship between the feature frequency and the capacity maintenance ratio is not affected by individual differences of the battery 10.

(4) The SOC

Figure 8:
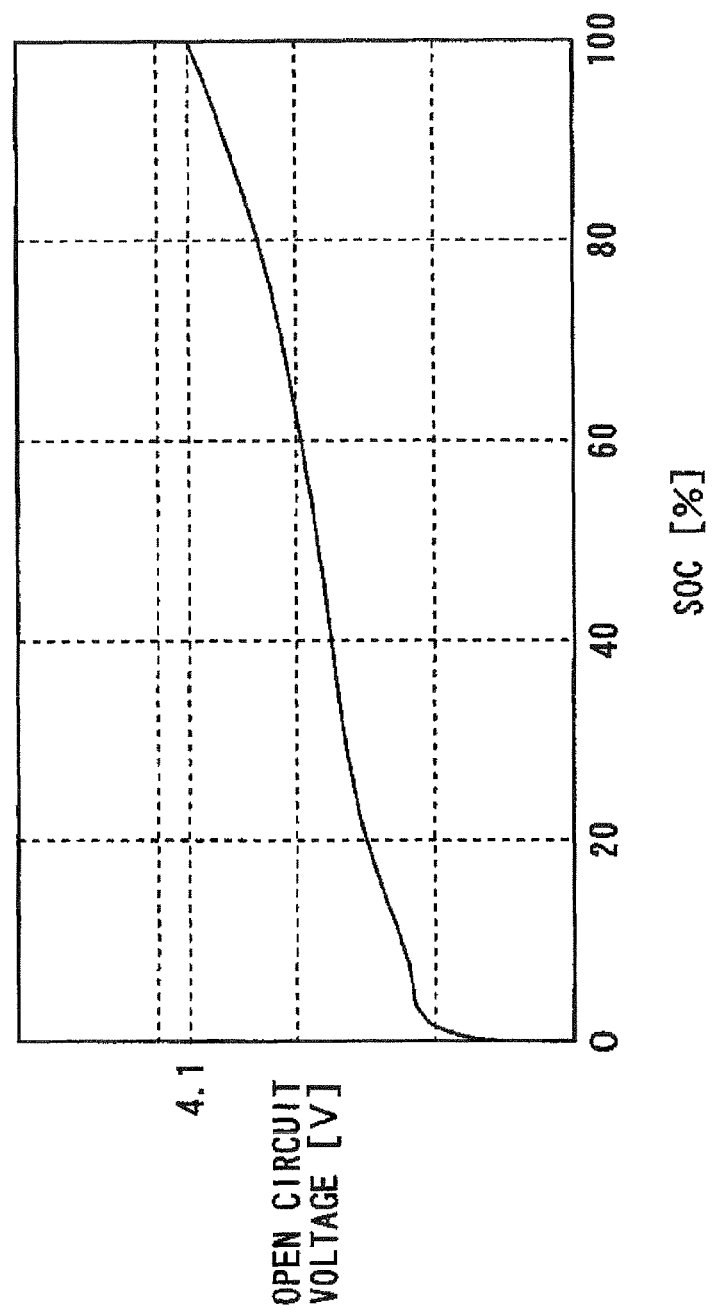
FIG. 8 is a diagram showing an example of a relationship between an open circuit voltage and an SOC of the battery.

A constant relationship exists between the open circuit voltage and the SOC of the battery 10 regardless of the value of the capacity maintenance ratio. FIG. 8 is a diagram showing an example of the relationship between the open circuit voltage and the SOC of the battery 10.

Here, a reference value of the SOC (hereinafter referred to as a reference SOC) is 100%, for example. In the example of FIG. 8, the open circuit voltage of the battery 10 in the reference SOC is 4.1 V.

The relationship between the open circuit voltage and the SOC of the battery 10, and the reference SOC are stored in the memory 230 of FIG. 9, described below. The SOC of the battery 10 can be determined from the open circuit voltage of the battery 10 detected by the voltage detector 20 of FIG. 1 and the relationship stored in the memory 230.

The relationship between the feature frequency and the capacity maintenance ratio varies depending on the SOC. Therefore, the capacity maintenance ratio determination device 100 of the present embodiment determines the capacity maintenance ratio when the SOC reaches the reference SOC, or adjusts the SOC to the reference SOC by charging the battery 10 at the time of the determination of the capacity maintenance ratio.

The reference SOC is not necessarily 100%, and may be a value other than 100% (such as 95%, 90%, 80% and 50%). In this case, the SOC may be adjusted to the reference SOC by charging or discharging the battery 10 at the time of the determination of the capacity maintenance ratio, for example.

This allows the capacity maintenance ratio to be determined without consideration of the SOC.

The charge/discharge of the battery 10 is generally controlled with the value of the SOC lower than 100% as a target value in order to prevent shorter life. In the hybrid electric vehicle, for example, the charge/discharge is normally controlled with the value of the SOC of about 50% as the target value.

Therefore, the reference SOC may be the SOC of the battery 10 that is set as the target value in the normal charge/discharge. In this case, the reference SOC is set to about 50% in the hybrid electric vehicle.

(5) Capacity Maintenance Ratio Determination Method of the Battery

The capacity maintenance ratio of the battery 10 is determined using the following methods.

(5-a) First Capacity Maintenance Ratio Determination Method

Figure 9:
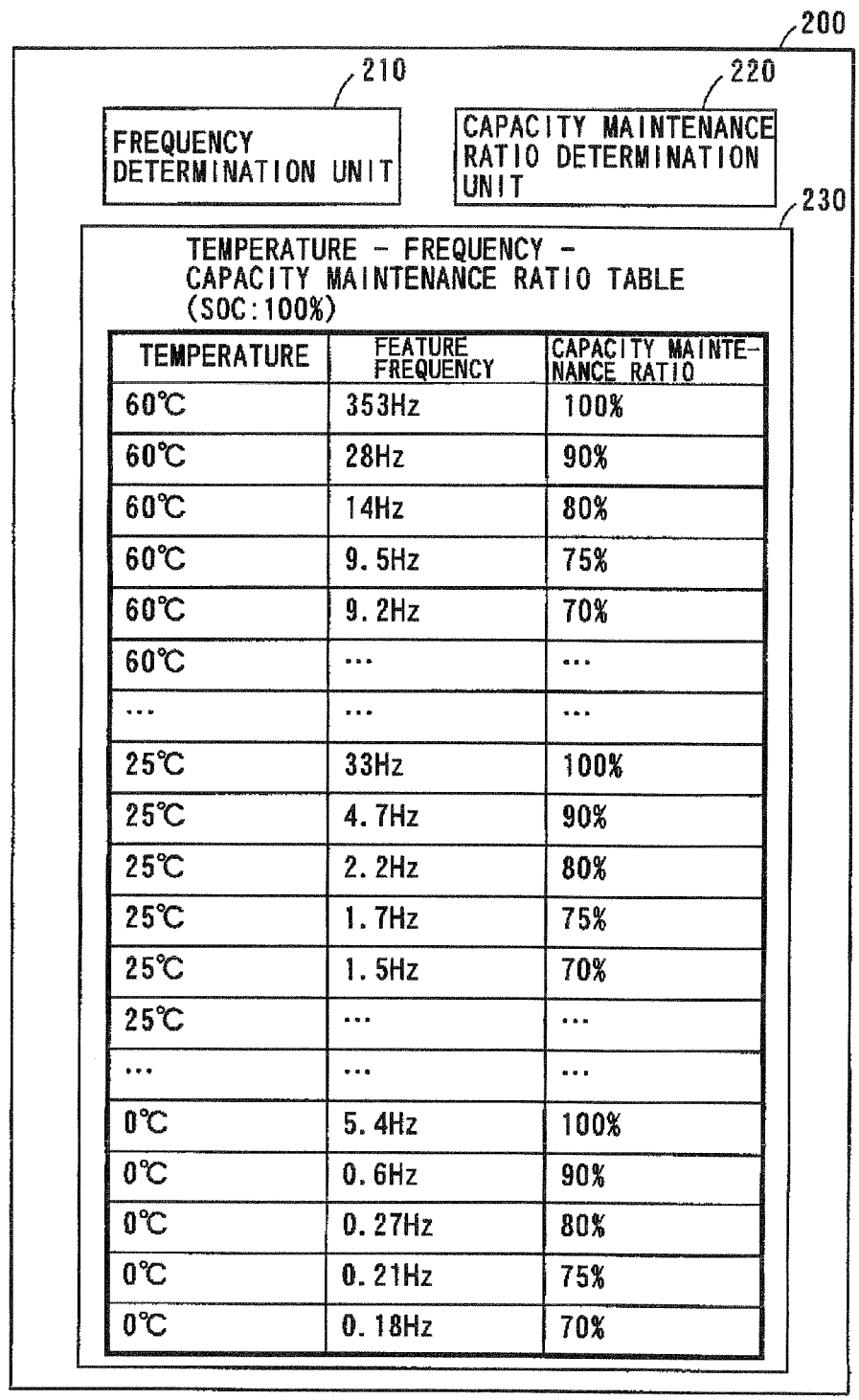
FIG. 9 is a block diagram showing the configuration of a capacity estimation unit of FIG. 1 used in a first capacity maintenance ratio determination method.

FIG. 9 is a block diagram showing the configuration of the capacity estimation unit 200 of FIG. 1 used in the first capacity maintenance ratio determination method. As described above, the capacity estimation unit 200 includes the frequency determination unit 210, the capacity maintenance ratio determination unit 220 and the memory 230.

The frequency determination unit 210 is composed of an arithmetic logic circuit, for example, and determines the feature frequency using any of the above-described first to third feature frequency determination methods.

When the first capacity maintenance ratio determination method is used, a temperature-frequency-capacity maintenance ratio table is previously stored in the memory 230.

The temperature-frequency-capacity maintenance ratio table shows a correspondence relationship among the temperature, the feature frequency and the capacity maintenance ratio of the battery 10 when the SOC of the battery 10 is the reference value (100%, for example).

According to the temperature-frequency-capacity maintenance ratio table of FIG. 9, the capacity maintenance ratio can be determined to be 100% when the temperature of the battery 10 is 60° C. and the feature frequency is 353 Hz, for example. The capacity maintenance ratio can be determined to be 90% when the temperature of the battery 10 is 60° C. and the feature frequency is 28 Hz. The capacity maintenance ratio can be determined to be 100% when the temperature of the battery 10 is 25° C. and the feature frequency is 33 Hz.

Figure 10:
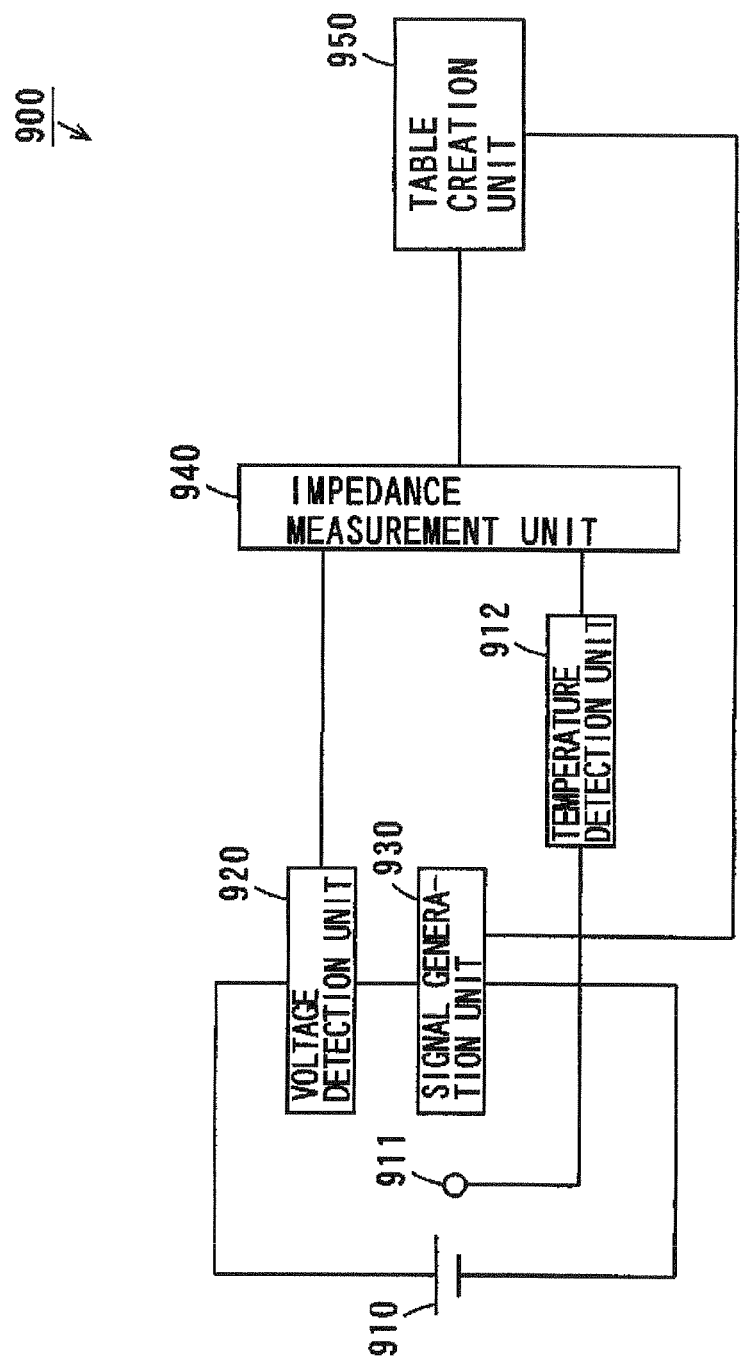
FIG. 10 is a block diagram showing one example of a table creation apparatus.

The temperature-frequency-capacity maintenance ratio table is created using a table creation apparatus described below. FIG. 10 a block diagram showing one example of the table creation apparatus. As shown in FIG. 10, the table creation apparatus 900 includes a battery 910, a thermistor 911, a temperature detection unit 912, a voltage detection unit 920, a signal generation unit 930, an impedance measurement unit 940 and a table creation unit 950.

These components excluding the table creation unit 950 correspond to the components of the battery system 500 of FIG. 1, respectively. The table creation unit 950 is composed of a CPU (Central Processing Unit) and a memory, for example, and controls the other components to create the temperature-frequency-capacity maintenance ratio table.

The battery 910 is connected to the power generator 300 and the motor 400 of FIG. 1, for example, during creation of the temperature-frequency-capacity maintenance ratio table. In the following description, a heating/cooling device, not shown, for adjusting the temperature of the battery 910 is provided near the battery 910. The heating/cooling device is controlled by the table creation unit 950.

In the creation of the temperature-frequency-capacity maintenance ratio table, a new battery 910 whose capacity maintenance ratio is 100% is used.

In this state, the table creation unit 950 controls the heating/cooling device based on the temperature of the battery 910 detected by the temperature detection unit 912, and adjusts the temperature of the battery 910 to a given temperature (60° C., for example).

Then, the table creation unit 950 causes the battery 910 to be completely discharged such that a remaining capacity is zero, and subsequently causes the battery 910 to be charged until the battery 910 is in a full charge state (the SOC=100%).

Then, the table creation unit 950 calculates a full charge capacity based on a current integrated value during the charge.

Next, when the SOC of the battery 910 is the reference SOC, the table creation unit 950 controls the signal generation unit 930 to apply an alternating signal having a plurality of frequency components (0.01 Hz to 400 Hz, for example) to the battery 910. In the case of the reference SOC of 100%, for example, the alternating signal having the plurality of frequency components is applied to the battery 910 when the battery 910 is in the full charge state.

The impedance measurement unit 940 calculates AC impedance based on a response signal output from the battery 910.

The table creation unit 950 determines a feature frequency based on the AC impedance calculated by the impedance measurement unit 940 using any of the foregoing first to third feature frequency determination methods. Accordingly, the value of the feature frequency when the temperature of the battery 910 is the foregoing temperature and the capacity maintenance ratio is 100% is determined.

The table creation unit 950 adjusts the temperature of the battery 910 to another temperature, and determines the feature frequency using the above-described method. The table creation unit 950 repeats the foregoing operation for each of the plurality of temperatures, and determines the feature frequency when the capacity maintenance ratio is 100% for each of the plurality of temperatures.

Next, the new battery 910 is replaced with a battery 910 that has been subjected to a plurality of cycles of charge/discharge. The table creation unit 950 causes the battery 910 to be completely discharged such that the remaining capacity is zero, and then causes the battery 910 to be charged until the battery 910 is in the full charge state (the SOC=100%). Then, the table creation unit 950 calculates the full charge capacity based on the current integrated value during the charge and calculates the value of the capacity maintenance ratio from the calculated full charge capacity.

The table creation unit 950 performs the same operation as that described above, thereby determining the feature frequency when the capacity maintenance ratio is the value calculated for each of the plurality of temperatures.

In the same manner, the battery 910 is replaced with another battery 910 having a different capacity maintenance ratio, and the same operation as that described above is repeated.

As a result, the correspondence relationship among the temperature, the feature frequency and the capacity maintenance ratio of the battery 910 is created. The created correspondence relationship is stored in the memory 230 of FIG. 9 as the temperature-frequency-capacity maintenance ratio table.

The feature frequency determination method at the time of determination of the capacity maintenance ratio is preferably the same as the feature frequency determination method at the time of creation of the temperature-frequency-capacity maintenance ratio table in order to accurately determine the capacity maintenance ratio.

While the temperature-frequency-capacity maintenance ratio table is created with the battery 910 connected to the power generator 300 and the motor 400 of FIG. 1 in the foregoing example, the temperature-frequency-capacity maintenance ratio table may be created with the battery 910 not connected to the power generator 300 and the motor 400 of FIG. 1.

Figure 11:
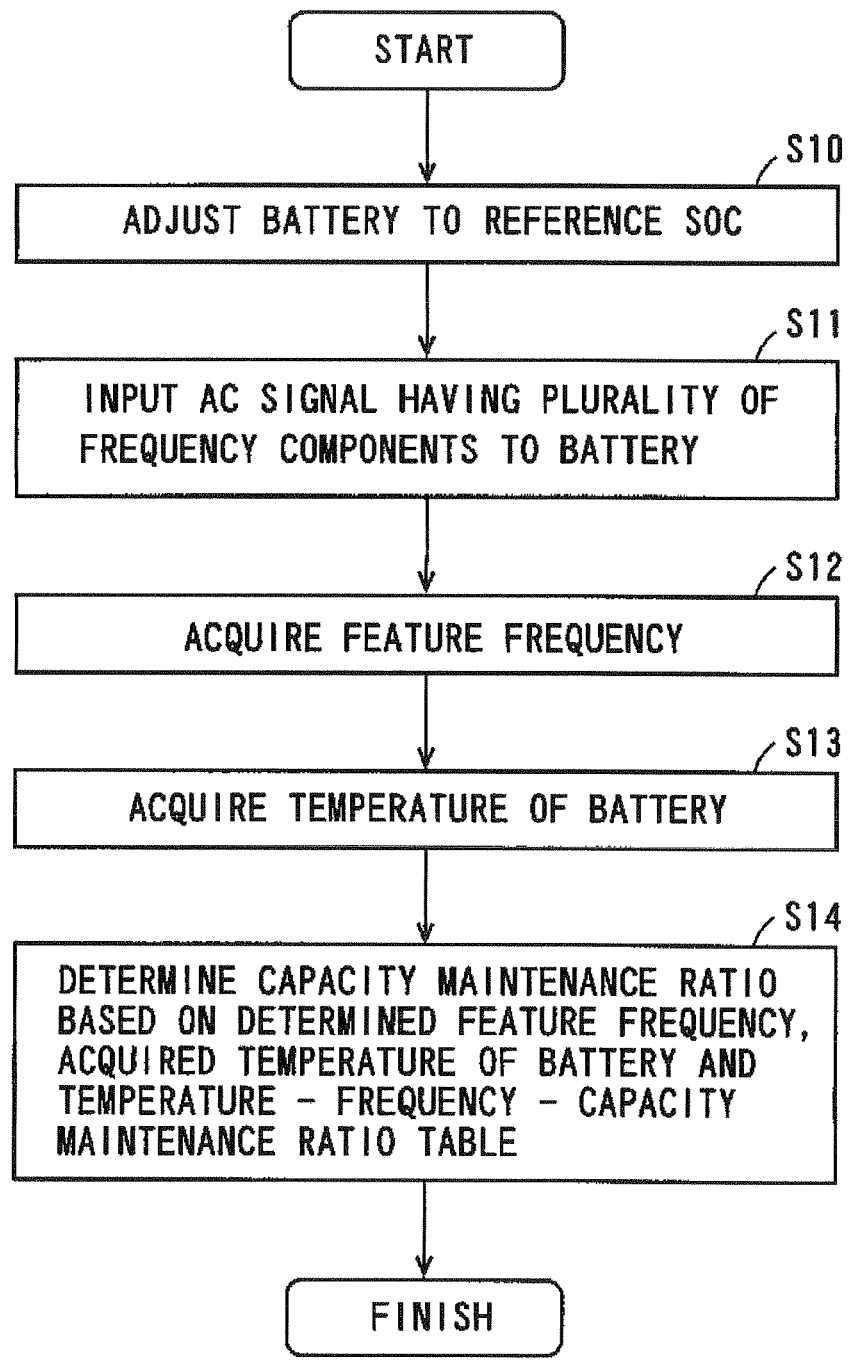
FIG. 11 is a flowchart showing an operation of a determination unit using the first capacity maintenance ratio determination method.

FIG. 11 is a flowchart showing the operation of the capacity maintenance ratio determination unit 220 using the first capacity maintenance ratio determination method. First, the capacity maintenance ratio determination unit 220 adjusts the battery 10 to the reference SOC based on the open circuit voltage of the battery 10 detected by the voltage detector 20 and the correspondence relationship between the open circuit voltage and the SOC stored in the memory 230 (Step S10). In this case, the capacity maintenance ratio determination unit 220 may control the charging device 520 of FIG. 1 to adjust the battery 10 to the reference SOC. Alternatively, the capacity maintenance ratio determination unit 220 may start the determination when the battery 10 enters the reference SOC.

Then, the capacity maintenance ratio determination unit 220 controls the signal generator 120 of FIG. 1 to input the alternating signal having the plurality of frequency components to the battery 10 (Step S11).

In this manner, the frequency characteristics of the AC impedance is calculated by the impedance measurement unit 110 of FIG. 1 based on the response signal output from the battery 10, and the feature frequency is determined by the frequency determination unit 210 of FIG. 9.

The capacity maintenance ratio determination unit 220 acquires the feature frequency determined by the frequency determination unit 210 (Step S12), and acquires the temperature of the battery 10 detected by the temperature detector 12 of FIG. 1 (Step S13).

The capacity maintenance ratio determination unit 220 subsequently determines the capacity maintenance ratio of the battery 10 based on the determined feature frequency, the acquired temperature and the temperature-frequency-capacity maintenance ratio table stored in the memory 230 of FIG. 9 (Step S14).

The capacity maintenance ratio determination unit 220 may calculate the full charge capacity at present by multiplying the full charge capacity in the initial charge/discharge cycle by the determined capacity maintenance ratio.

In this example, the correspondence relationship among the temperature, the feature frequency and the capacity maintenance ratio of the battery 910 is stored in the memory 230 as discrete data as shown in the temperature-frequency-capacity maintenance ratio table of FIG. 9.

Here, when each of the determined feature frequency and the acquired temperature is a value that falls between the discrete data of the temperature-frequency-capacity maintenance ratio table in Step S14, the capacity maintenance ratio determination unit 220 may determine the capacity maintenance ratio by interpolating the discrete data. This improves determination accuracy of the capacity maintenance ratio.

(5-b) Second Capacity Maintenance Ratio Determination Method

Here, a value of the feature frequency in a reference value of the capacity maintenance ratio (hereinafter referred to as a reference capacity maintenance ratio) is referred to as a reference feature frequency. A ratio of a value of the feature frequency to the reference feature frequency in each capacity maintenance ratio is referred to as a feature frequency ratio.

When the reference capacity maintenance ratio is 100%, for example, the feature frequency ratio at the capacity maintenance ratio of 100° A) is one.

FIG. 12 is a diagram showing a relationship between the feature frequency ratio and the capacity maintenance ratio. In FIG. 12, the ordinate indicates the feature frequency ratio, and the abscissa indicates the capacity maintenance ratio. The squares and triangles indicate the relationships between the feature frequency ratio and the capacity maintenance ratio when the temperature of the battery 10 is 25° C., and the circles indicate the relationship between the feature frequency ratio and the capacity maintenance ratio when the temperature of the battery 10 is 0° C.

The relationships between the feature frequency ratio and the capacity maintenance ratio of FIG. 12 are found from the relationships between the feature frequency and the capacity maintenance ratio of FIG. 7. Specifically, the relationships between the feature frequency ratio and the capacity maintenance ratio of FIG. 12 are obtained by normalizing the value of the feature frequency in each capacity maintenance ratio of FIG. 7 with the reference feature frequency (the value of the feature frequency when the capacity maintenance ratio is 100%, for example) taken as one.

As shown in FIG. 12, the relationships between the feature frequency ratio and the capacity maintenance ratio substantially coincide with one another even though the battery 10 has the different temperatures.

Accordingly, when the reference feature frequency in each temperature of the battery 10 is known, the feature frequency ratio in each temperature can be calculated by determining the feature frequency in each temperature.

Figure 13:
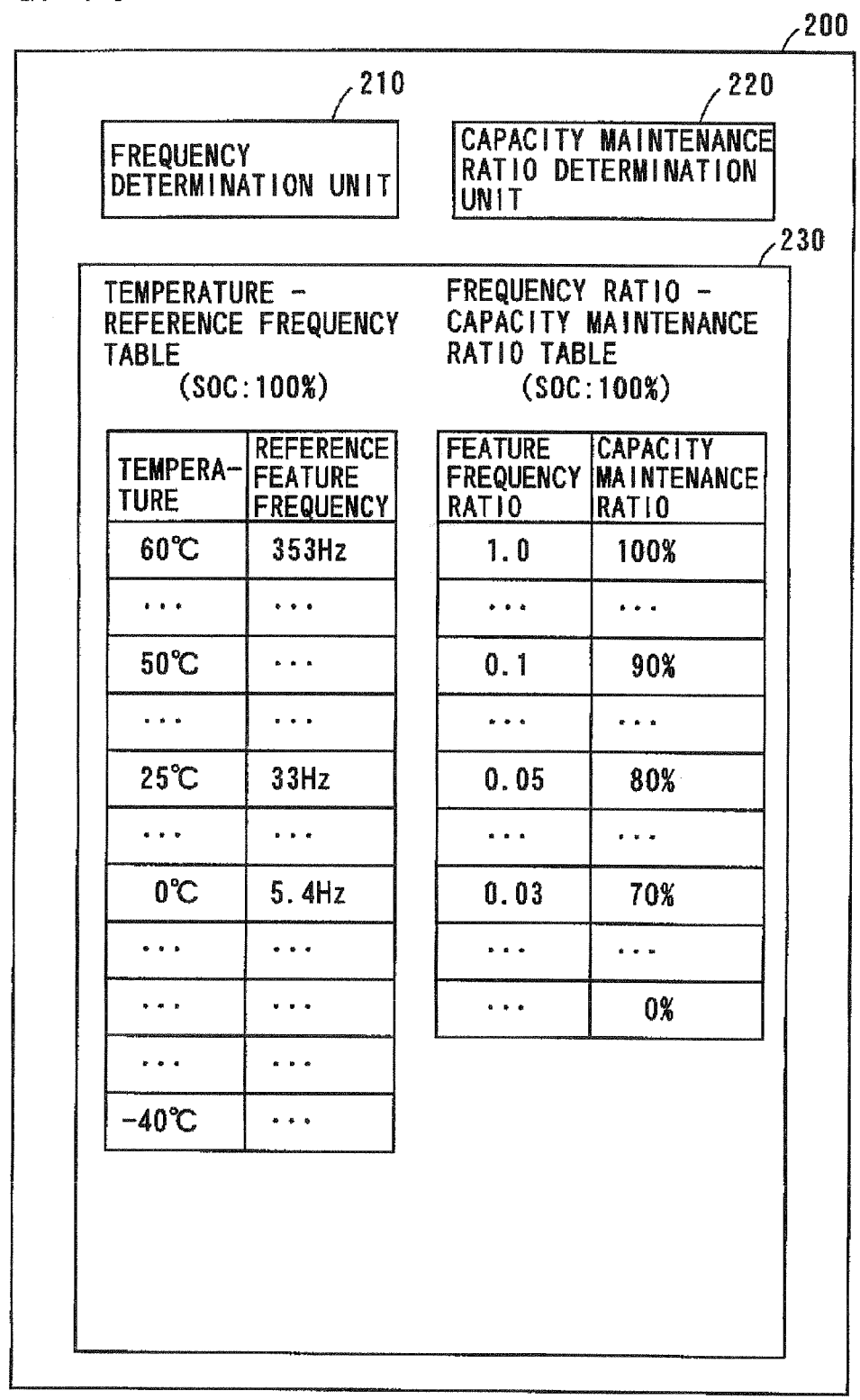
FIG. 13 is a block diagram showing the configuration of the capacity estimation unit of FIG. 1 used in a second capacity maintenance ratio determination method.

FIG. 13 is a block diagram showing the configuration of the capacity estimation unit 200 of FIG. 1 used in the second capacity maintenance ratio determination method.

When the second capacity maintenance ratio determination method is used, a temperature-reference frequency table and a frequency ratio-capacity maintenance ratio table are previously stored in the memory 230.

The temperature-reference frequency table shows a correspondence relationship between the temperature in the reference SOC (100%, for example) and the reference feature frequency of the battery 10. The frequency ratio-capacity maintenance ratio table shows a correspondence relationship between the feature frequency ratio and the capacity maintenance ratio.

Suppose, for example, that the temperature of the battery 10 is 60° C. and the determined feature frequency is 35.3 Hz. In this case, the reference feature frequency of 353 Hz corresponding to 60° C. is acquired based on the temperature-reference frequency table of FIG. 13. Then, a ratio of the determined feature frequency to the acquired reference feature frequency is calculated to be the feature frequency ratio of 0.1. Accordingly, the capacity maintenance ratio of 90% corresponding to the feature frequency ratio of 0.1 is acquired from the frequency ratio-capacity maintenance ratio table of FIG. 13.

The temperature-reference frequency table and the frequency ratio-capacity maintenance ratio table of FIG. 13 can be created using the table creation apparatus 900 of FIG. 10.

In this case, the table creation unit 950 determines the feature frequencies for the plurality of temperatures as the reference feature frequencies using the battery 910 having the reference capacity maintenance ratio. As a result, a correspondence relationship between the temperature of the battery 910 and the reference feature frequency is created. The created correspondence relationship is stored in the memory 230 of FIG. 13 as the temperature-reference frequency table.

The table creation unit 950 determines the feature frequency for a given temperature using a plurality of batteries 910 having different capacity maintenance ratios, and calculates the feature frequency ratio from the ratio of the feature frequency determined for each capacity maintenance ratio to the reference feature frequency. As a result, the correspondence relationship between the feature frequency ratio and the capacity maintenance ratio is created. The created correspondence relationship is stored in the memory 230 of FIG. 13 as a feature frequency ratio-capacity maintenance ratio table.

The feature frequency determination method at the time of determination of the capacity maintenance ratio is preferably the same as the feature frequency determination method at the time of creation of the temperature-reference frequency table and the frequency ratio-capacity maintenance ratio table in order to accurately determine the capacity maintenance ratio.

Figure 14:
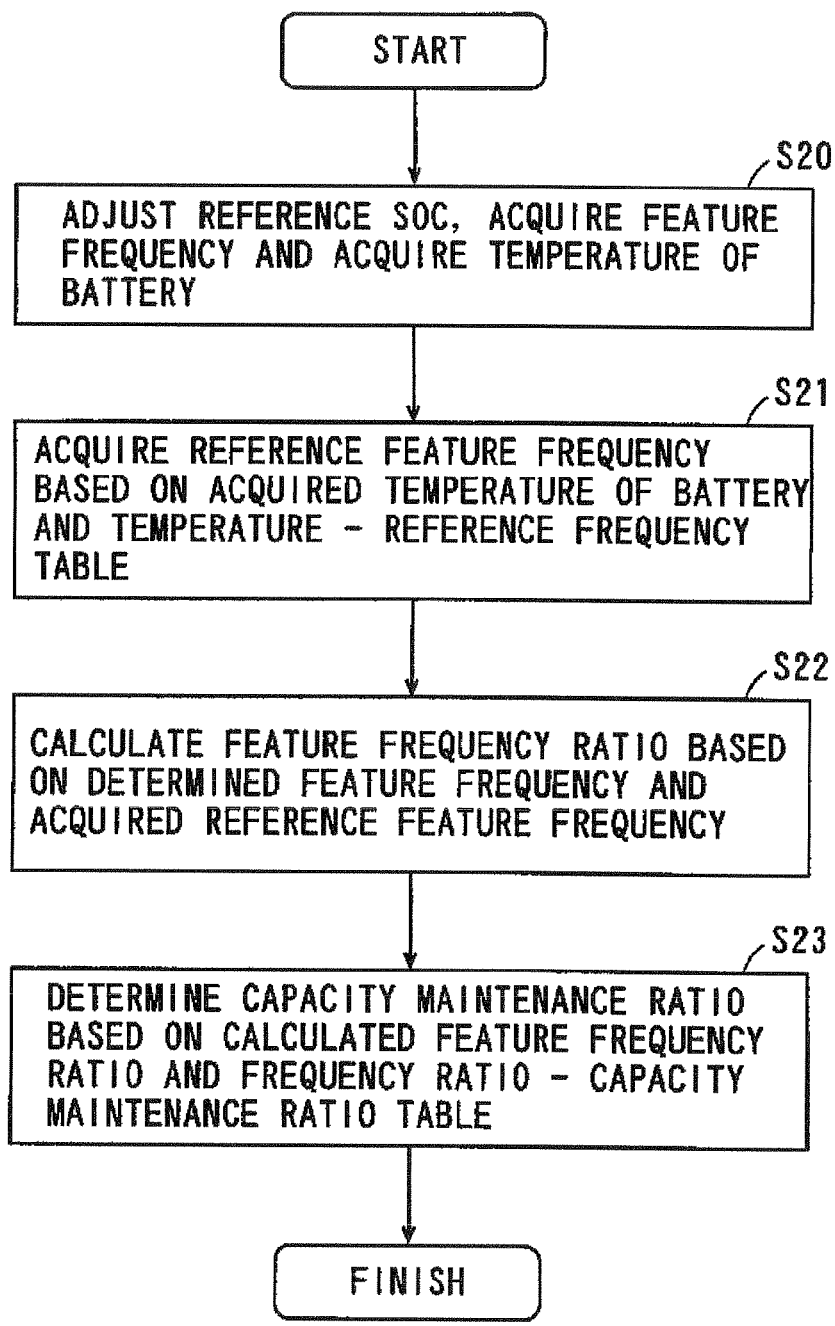
FIG. 14 is a flowchart showing an operation of the determination unit using the second capacity maintenance ratio determination method.

FIG. 14 is a flowchart showing the operation of the capacity maintenance ratio determination unit 220 using the second capacity maintenance ratio determination method.

First, the capacity maintenance ratio determination unit 220 adjusts the reference SOC, acquires the feature frequency and acquires the temperature of the battery 10 similarly to the operation in Steps S10 to S13 of FIG. 11 (Step S20).

The capacity maintenance ratio determination unit 220 subsequently acquires the reference feature frequency corresponding to the temperature of the battery 10 based on the temperature-reference frequency table stored in the memory 230 of FIG. 13 (Step S21).

Next, the capacity maintenance ratio determination unit 220 calculates the feature frequency ratio based on the determined feature frequency and the acquired reference feature frequency (Step S22). The capacity maintenance ratio determination unit 220 then determines the capacity maintenance ratio of the battery 10 based on the calculated feature frequency ratio and the frequency ratio-capacity maintenance ratio table stored in the memory 230 of FIG. 13 (Step S23).

The capacity maintenance ratio determination unit 220 may calculate the full charge capacity at present by multiplying the full charge capacity in the initial charge/discharge cycle by the determined capacity maintenance ratio.

In this example, the correspondence relationship between the temperature of the battery 910 and the reference feature frequency is stored in the memory 230 as discrete data as shown in the temperature-reference frequency table of FIG. 13.

Here, when the acquired temperature is a value that falls between the discrete data of the temperature-reference frequency table in Step S21, the capacity maintenance ratio determination unit 220 may acquire the reference feature frequency corresponding to a temperature of the battery 10 acquired by interpolating the discrete data.

In this example, the correspondence relationship between the feature frequency ratio and the capacity maintenance ratio is stored in the memory 230 as discrete data as shown in the frequency ratio-capacity maintenance ratio table of FIG. 13.

Here, when the calculated feature frequency ratio is a value that falls between the discrete data of the frequency ratio-capacity maintenance ratio table in Step S23, the capacity maintenance ratio determination unit 220 may determine the capacity maintenance ratio corresponding to a feature frequency ratio calculated by interpolating the discrete data.

As described above, determination accuracy of the capacity maintenance ratio is improved by interpolating the discrete data in the temperature-reference frequency table and the frequency ratio-capacity maintenance ratio table stored in the memory 230.

(5-c) Third Capacity Maintenance Ratio Determination Method

In the third capacity maintenance ratio determination method, the feature frequency in a given temperature (the temperature of the battery 10 at the time of determination of the capacity maintenance ratio, for example) is corrected to the feature frequency in a reference temperature using a temperature correction equation led from Arrhenius rule.

The temperature correction equation is expressed as follows:

$$\ln(f_n) = \ln(f_r) + a\{(1/T_r) - (1/T_n)\} \quad (A)$$

In the foregoing equation (A), $f_n$ represents the feature frequency in the reference SOC and in the temperature of the battery 10 at the time of determination of the capacity maintenance ratio. $f_r$ represents the feature frequency in the reference SOC and in the reference temperature. $T_n$ represents the temperature (absolute temperature) of the battery 10 at the time of determination of the capacity maintenance ratio, and $T_r$ represents the reference temperature (absolute temperature). "a" represents a temperature correction coefficient in the reference SOC, and previously found by measurement.

The feature frequency $f_r$ in the reference temperature is converted into the feature frequency $f_n$ in the temperature at the time of determination of the capacity maintenance ratio using the foregoing equation (A). Accordingly, when the reference feature frequency in the reference temperature (the feature frequency in the reference capacity maintenance ratio) is known, the feature frequency ratio in the temperature at the time of determination of the capacity maintenance ratio can be calculated.

Figure 15:
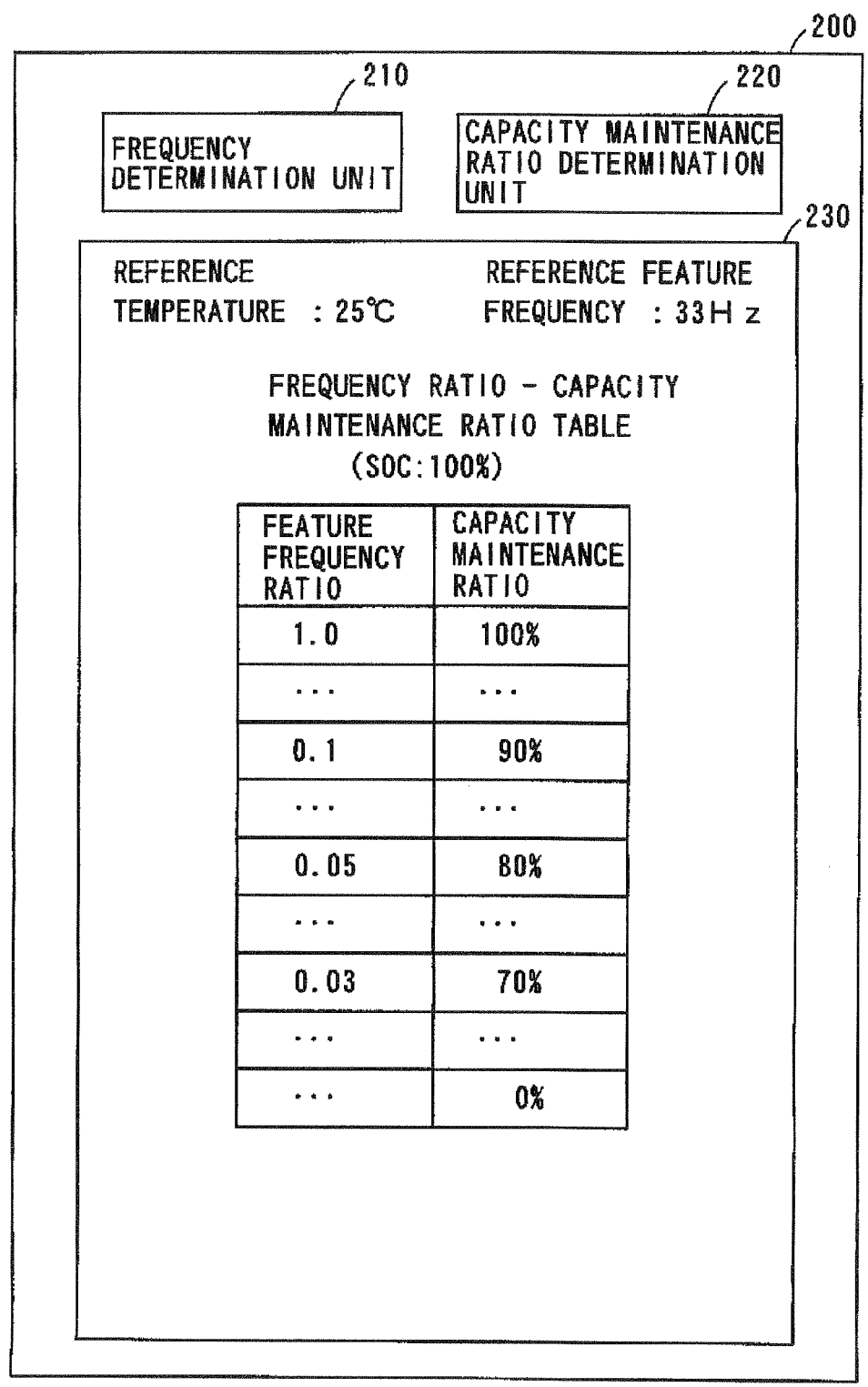
FIG. 15 is a block diagram showing the configuration of the capacity estimation unit of FIG. 1 used in a third capacity maintenance ratio determination method.

FIG. 15 is a block diagram showing the configuration of the capacity estimation unit 200 of FIG. 1 used in the third capacity maintenance ratio determination method.

When the third capacity maintenance ratio determination method is used, the reference temperature, the reference feature frequency corresponding to the reference temperature, and the frequency ratio-capacity maintenance ratio table are previously stored in the memory 230. The reference temperature is 25° C. (=298 K), and the reference feature frequency is 33 Hz, for example.

The frequency ratio-capacity maintenance ratio table used in the third capacity maintenance ratio determination method is the same as that used in the second determination method.

Suppose, for example, that the temperature of the battery 10 is 60° C. and the determined feature frequency is 35.3 Hz. In this case, an operation of the foregoing equation (A) is performed using the detected temperature of 60° C. (=333K) of the battery 10, the reference temperature 25° C. (=298 K) stored in the memory 230 and the reference feature frequency 33 Hz stored in the memory 230. Thus, the reference feature frequency of 33 Hz in the reference temperature stored in the memory 230 is corrected, and the reference feature frequency of 353 Hz in the detected temperature of 60° C. of the battery 10 is calculated.

Then, the ratio of the determined feature frequency to the corrected reference feature frequency is calculated to be the feature frequency ratio of 0.1. Accordingly, the capacity maintenance ratio can be determined to be 90% based on the frequency ratio-capacity maintenance ratio table of FIG. 15.

Figure 16:
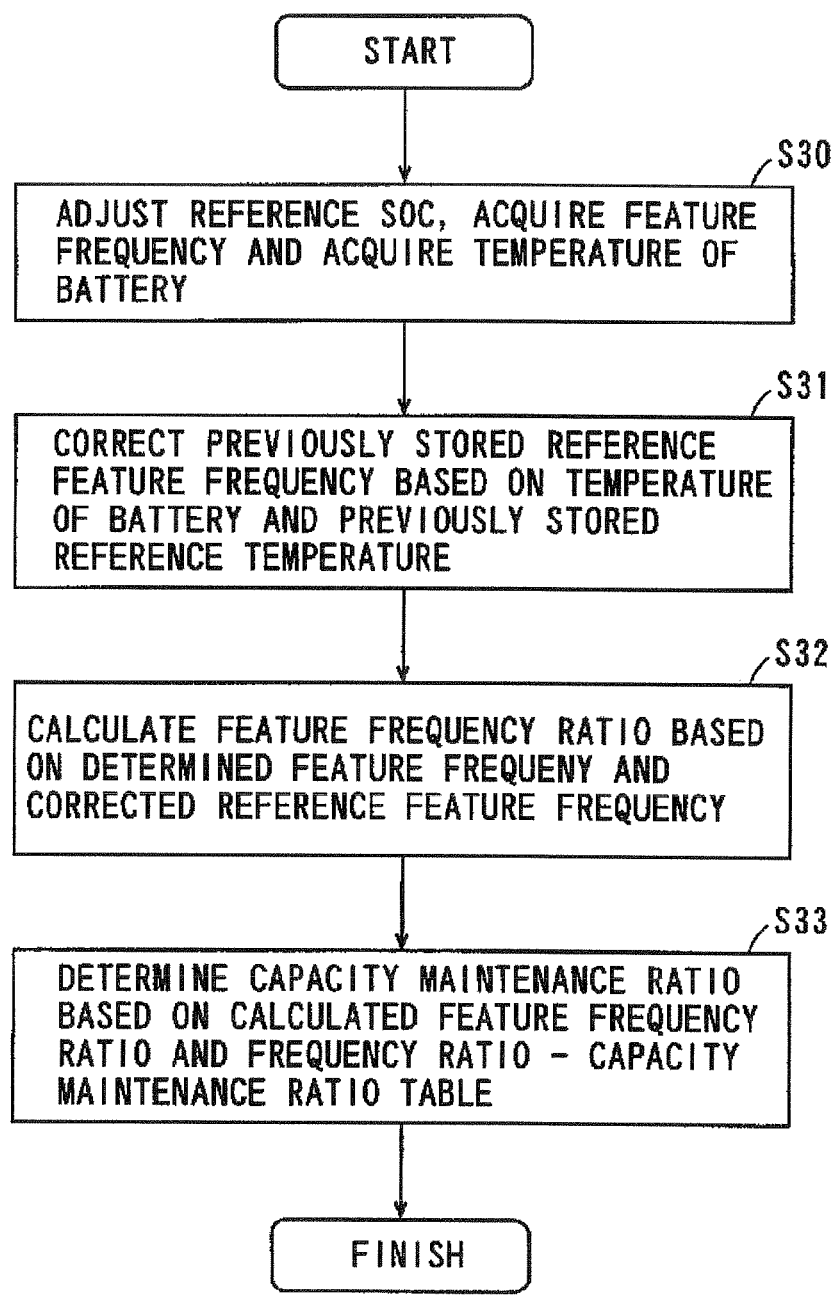
FIG. 16 is a flowchart showing an operation of the determination unit using the third capacity maintenance ratio determination method.

FIG. 16 is a flowchart showing the operation of the capacity maintenance ratio determination unit 220 using the third capacity maintenance ratio determination method. First, the capacity maintenance ratio determination unit 220 adjusts the reference SOC, acquires the feature frequency and acquires the temperature similarly to the operation in Steps S10 to S13 of FIG. 11 (Step S30).

Next, the capacity maintenance ratio determination unit 220 corrects the reference feature frequency previously stored in the memory 230 of FIG. 15 based on the temperature of the battery 10 and the reference temperature previously stored in the memory 230 of FIG. 15 (Step S31).

The capacity maintenance ratio determination unit 220 subsequently calculates the feature frequency ratio based on the determined feature frequency and the corrected reference feature frequency (Step S32). Then, the capacity maintenance ratio determination unit 220 determines the capacity maintenance ratio of the battery 10 based on the calculated feature frequency ratio and the frequency ratio-capacity maintenance ratio table stored in the memory 230 of FIG. 15 (Step S33).

The capacity maintenance ratio determination unit 220 may calculate the full charge capacity at present by multiplying the full charge capacity in the initial charge/discharge cycle by the determined capacity maintenance ratio.

In this example, the correspondence relationship between the feature frequency ratio and the capacity maintenance ratio is stored in the memory 230 as discrete data as shown in the frequency ratio-capacity maintenance ratio table of FIG. 15.

Here, when the calculated feature frequency ratio is a value that falls between the discrete data of the frequency ratio-capacity maintenance ratio table in Step S33, the capacity maintenance ratio determination unit 220 may determine the capacity maintenance ratio corresponding to a calculated feature frequency ratio by interpolating the discrete data. This improves the determination accuracy of the capacity maintenance ratio.

(6) Working Effect

As described above, the capacity maintenance ratio is determined based on the response signal output from the batteries 10 in response to the alternating signal of the signal generator 120 and so on, so that the capacity maintenance ratio can be determined in a short period of time without charging/discharging the batteries 10 in the capacity maintenance ratio determination device 100, the battery system 500 and the electric vehicle 1000A according to the present embodiment.

The capacity maintenance ratio is determined based on the relationship between the value of the predetermined feature frequency in the frequency characteristics of the AC impedance and the capacity maintenance ratio (the foregoing temperature-frequency-capacity maintenance ratio table or frequency ratio-capacity maintenance ratio table), thus improving the determination accuracy of the capacity maintenance ratio.

In the electric vehicle 1000A, the information about the capacity maintenance ratio determined by the capacity maintenance ratio determination device 100 is transmitted to the presentation apparatus 530 through the communicator 550 of the battery system 500. This allows a user of the electric vehicle 1000A to easily recognize the capacity maintenance ratio of the batteries 10 based on the information about the capacity maintenance ratio of each battery 10 presented by the presentation apparatus 530.

When the feature frequency is determined based on a particular value (hereinafter referred to as a feature value), the capacity maintenance ratio may be determined based on a relationship between predetermined feature value and the capacity maintenance ratio instead of the relationship between the predetermined value of the feature frequency and the capacity maintenance ratio.

For example, in the second feature frequency determination method, the feature frequency fpeak1 is determined based on the larger value of the product $R_1C_1$ of the value $C_1$ of the capacitance component C1 and the values $R_1$ of the resistance component R1, and the product $R_2C_2$ of the value $C_2$ of the capacitance component C2 and the value $R_2$ of the resistance component R2 in the first and second parallel circuits 10a, 10b included in the equivalent circuit of the battery 10.

Accordingly, the largest value among the products of the values of the capacitance components and the values of the resistance components of the one or plurality of parallel circuits included in the equivalent circuit of the battery 10 may be the foregoing feature value. In this case, a relationship among the product of the value of the capacitance component and the value of the resistance component of the parallel circuits included in the equivalent circuit of the battery 10, the temperature of the battery 10 and the capacity maintenance ratio is previously stored in the memory 230 as a table, so that the capacity maintenance ratio can be determined based on the relationship between the feature value and the capacity maintenance ratio similarly to the operation in the first capacity maintenance ratio determination method.

With the feature value in the foregoing reference capacity maintenance ratio taken as a reference feature value and a ratio of the feature value in each capacity maintenance ratio to the reference feature value taken as a feature ratio, a correspondence relationship between the feature ratio and the capacity maintenance ratio may be created to be stored in the memory 230 as a table. In this case, a correspondence relationship between the temperature of the battery 10 and the reference feature value is further stored in the memory 230 as a table, thereby allowing the capacity maintenance ratio to be determined based on the correspondence relationship between the feature ratio and the capacity maintenance ratio similarly to the operation in the second capacity maintenance ratio determination method.

With the largest value among the products of the values of the capacitance components and the values of the resistance components of the one or plurality of parallel circuits included in the equivalent circuit of the battery 10 taken as the feature value, the feature ratio α between the feature value RxCx in each capacity maintenance ratio and the reference feature value RyCy (the feature value in the reference capacity maintenance ratio) is represented by α=RxCx/RyCy.

(7) Example of Application of the Capacity Maintenance Ratio Determination Device to Another Electric Vehicle The foregoing capacity maintenance ratio determination device 100 can be applied to another electric vehicle other than the hybrid electric vehicle.

Figure 17:
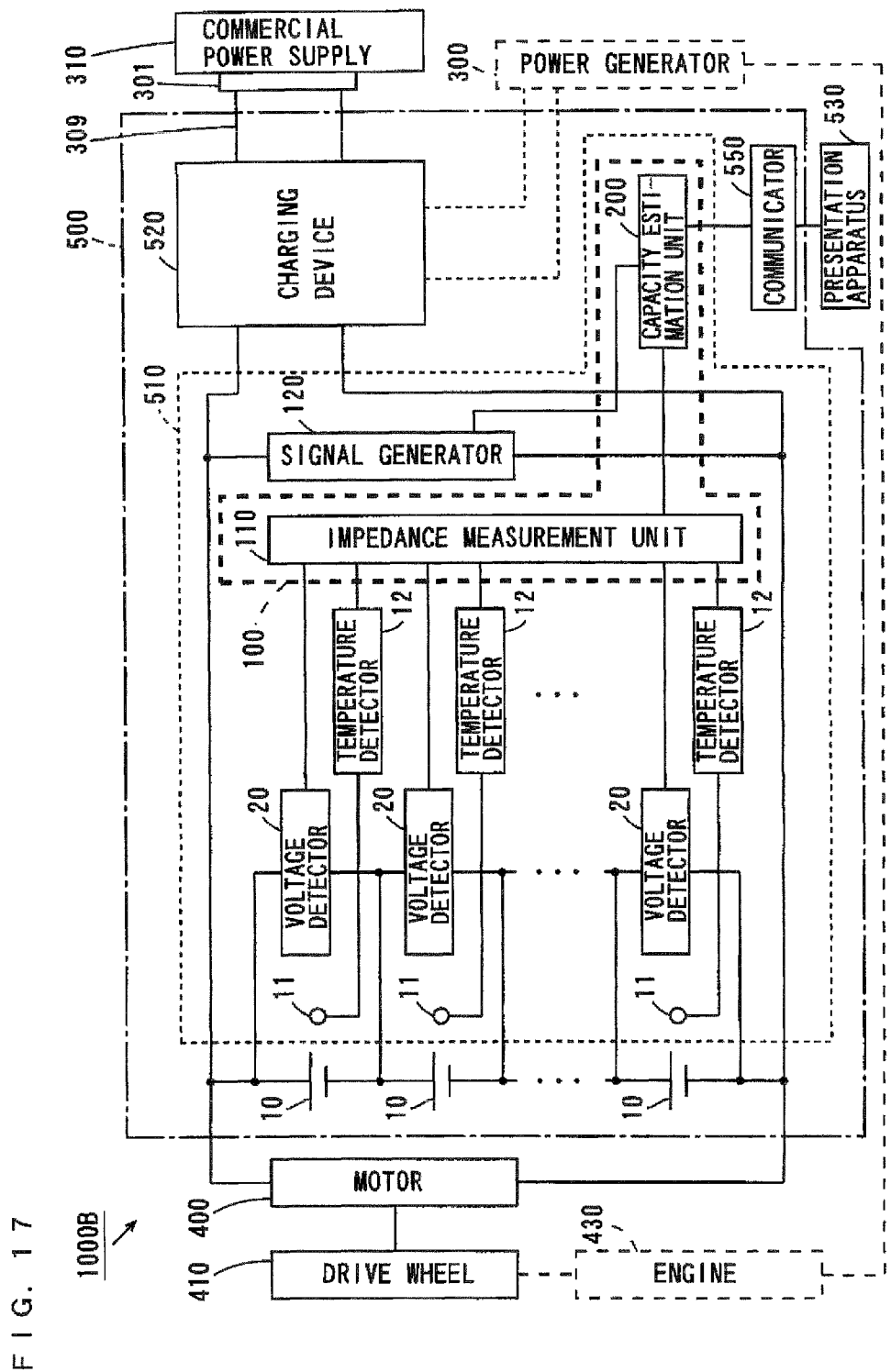
FIG. 17 is a diagram showing another example of the electric vehicle including the capacity maintenance ratio determination device of FIG. 1.

FIG. 17 is a diagram showing another example of the electric vehicle including the capacity maintenance ratio determination device 100 of FIG. 1. A battery electric vehicle is employed as an electric vehicle 1000B in this example. Description will be made of the electric vehicle 1000B while referring to differences from the electric vehicle 1000A of FIG. 1.

As shown in FIG. 17, the electric vehicle 1000B includes cables 309, a connector 301, the motor 400, the drive wheel 410, the battery system 500 and the presentation apparatus 530.

The motor 400 is connected to the drive wheel 410, and functions as a power source of the electric vehicle 1000B. The cables 309 are provided to extend from the charging device 520 to the exterior of the battery system 500. The connector 301 is attached to one ends of the cables 309, and is connectable to a commercial power supply 310.

The connector 301 is connected to the commercial power supply 310 when the plurality of batteries 10 of the battery system 500 are charged. In this case, the charging device 520 converts electric power supplied from the commercial power supply 310 into electric power suitable for charging the plurality of batteries 10, and supplies the converted electric power to the plurality of batteries 10. This causes the plurality of batteries 10 to be charged. When the charge of the plurality of batteries 10 is finished, the connector 301 is removed from the commercial power supply 310. This allows the electric vehicle 1000B to be driven.

The engine 430 and the power generator 300 included in the electric vehicle 1000A of FIG. 1 may be added to the configuration of the electric vehicle 1000B as indicated by the broken lines in FIG. 17.

In this case, the engine 430 is connected to the drive wheel 410 while being connected to the charging device 520 of the battery system 500 through the power generator 300. This allows for the configuration of a plug-in hybrid electric vehicle.

In the plug-in hybrid electric vehicle, the connector 301 is connected to the commercial power supply 310, thereby allowing the plurality of batteries 10 to be charged using the electric power supplied from the commercial power supply 310. In addition, when the engine 430 is operated, the plurality of batteries 10 can be charged with electric power generated in the power generator 300 by the torque of the engine 430.

The capacity maintenance ratio determination device 100 and the battery system 500 of FIG. 1 are mounted in the electric vehicle 1000B of FIG. 17. This provides the same effects as those in the electric vehicle 1000A of FIG. 1.

(8) Example of Application of the Battery System to Backup Power Supply Device

The foregoing capacity maintenance ratio determination device 100 and battery system 500 can be applied to a backup power supply device.

Figure 18:
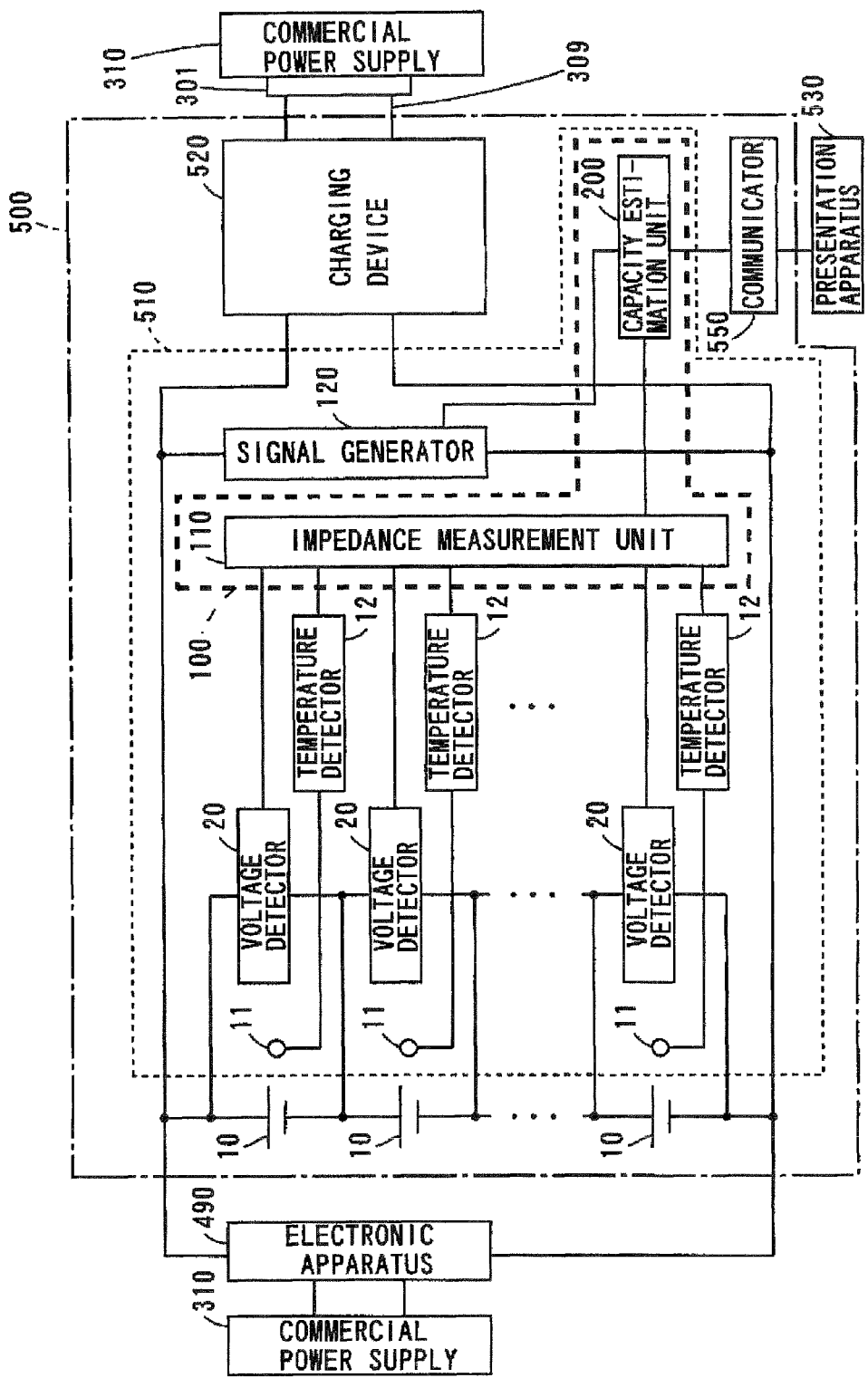
FIG. 18 is a block diagram showing an example of application of the capacity maintenance ratio determination device of FIG. 1 to a backup power supply device.

FIG. 18 is a block diagram showing an example of application of the capacity maintenance ratio determination device 100 of FIG. 1 to the backup power supply device. As shown in FIG. 18, the cables 309 and the connector 301 are provided in the battery system 500 of FIG. 1 in this example. The cables 309 are provided to extend from the charging device 520 to the exterior of the battery system 500. The connector 301 is attached to one ends of the cables 309, and is connectable to the commercial power supply 310.

An electronic apparatus 490 is connected to the plurality of batteries 10 of the battery system 500 while being connected to the commercial power supply 310. In this case, the plurality of batteries 10 of the battery system 500 function as an electric power supply source of the electronic apparatus 490 in the case of emergency such as power failure. Normally, the commercial power supply 310 functions as the electric power supply source of the electronic apparatus 490.

Accordingly, the electric power is supplied from the plurality of batteries 10 of the battery system 500 to the electronic apparatus 490 in the case where the electric power is not supplied from the commercial power supply 310 to the electronic apparatus 490 because of power failure, for example.

In this manner, the capacity maintenance ratio determination device 100 and the battery system 500 according to the one embodiment of the present invention is also applicable to the backup power supply device.

(9) Other Examples of the Configuration of the Battery System

Figure 19:
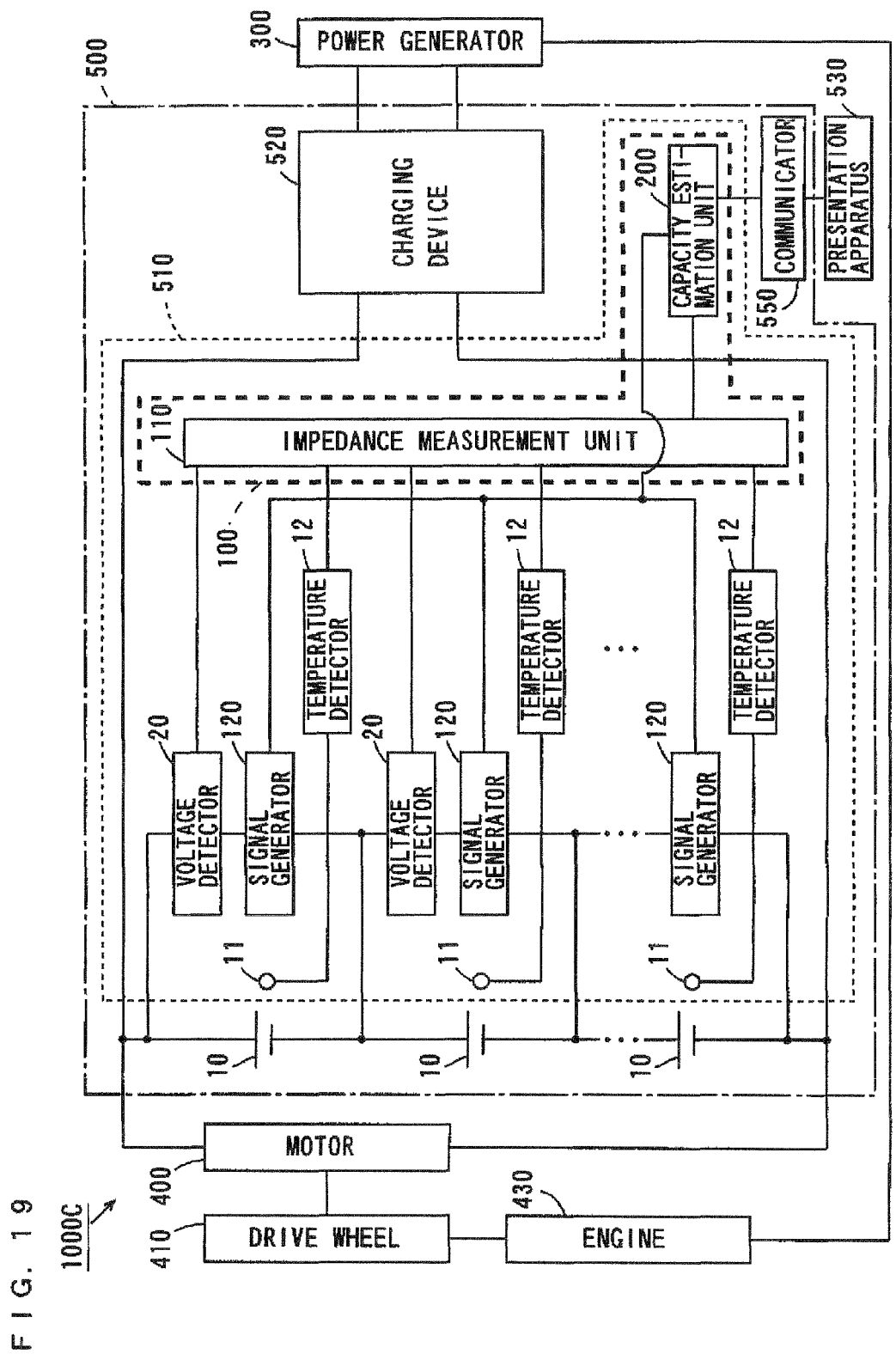
FIG. 19 is a block diagram of an electric vehicle including a battery system according to another example of the configuration.
Figure 20:
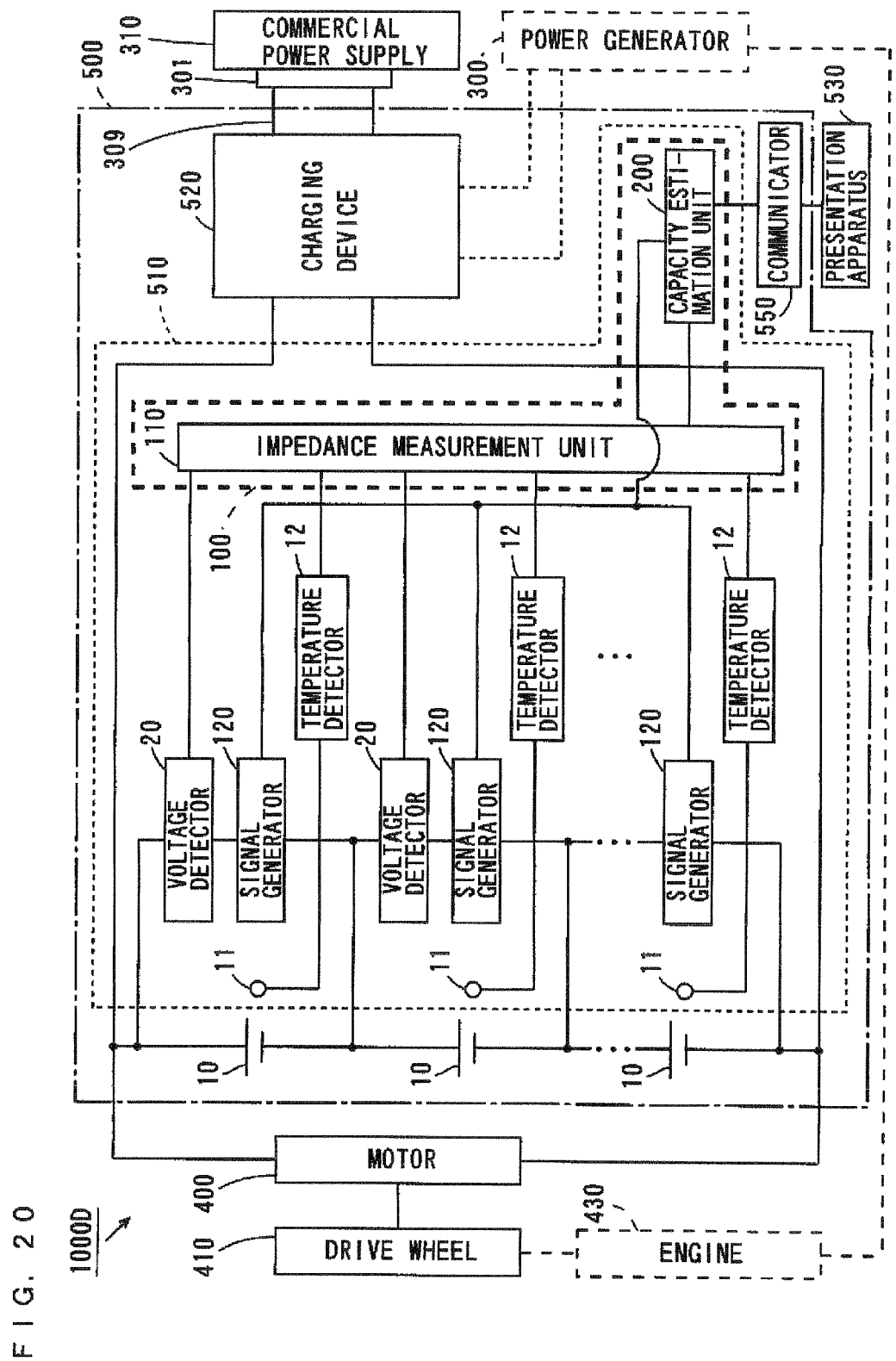
FIG. 20 is a block diagram of an electric vehicle including a battery system according to another example of the configuration.

FIGS. 19 and 20 are block diagrams of electric vehicles including battery systems 500 according to other examples of the configuration. The electric vehicle 1000C of FIG. 19 is a hybrid electric vehicle, and has the same configuration as the electric vehicle 1000A of FIG. 1 except for the configuration of the battery system 500. The electric vehicle 1000D of FIG. 20 is a battery electric vehicle or a plug-in hybrid electric vehicle, and has the same configuration as the electric vehicle 1000B of FIG. 17 except for the configuration of the battery system 500.

As shown in FIGS. 19 and 20, the battery systems 500 of the examples each have a plurality of signal generators 120, which are connected in parallel with the plurality of batteries 10, respectively. This causes the alternating signal having the plurality of frequency components to be applied from the plurality of signal generators 120 to the corresponding batteries 10 at the time of determination of the capacity maintenance ratio of the plurality of batteries 10.

Figure 21:
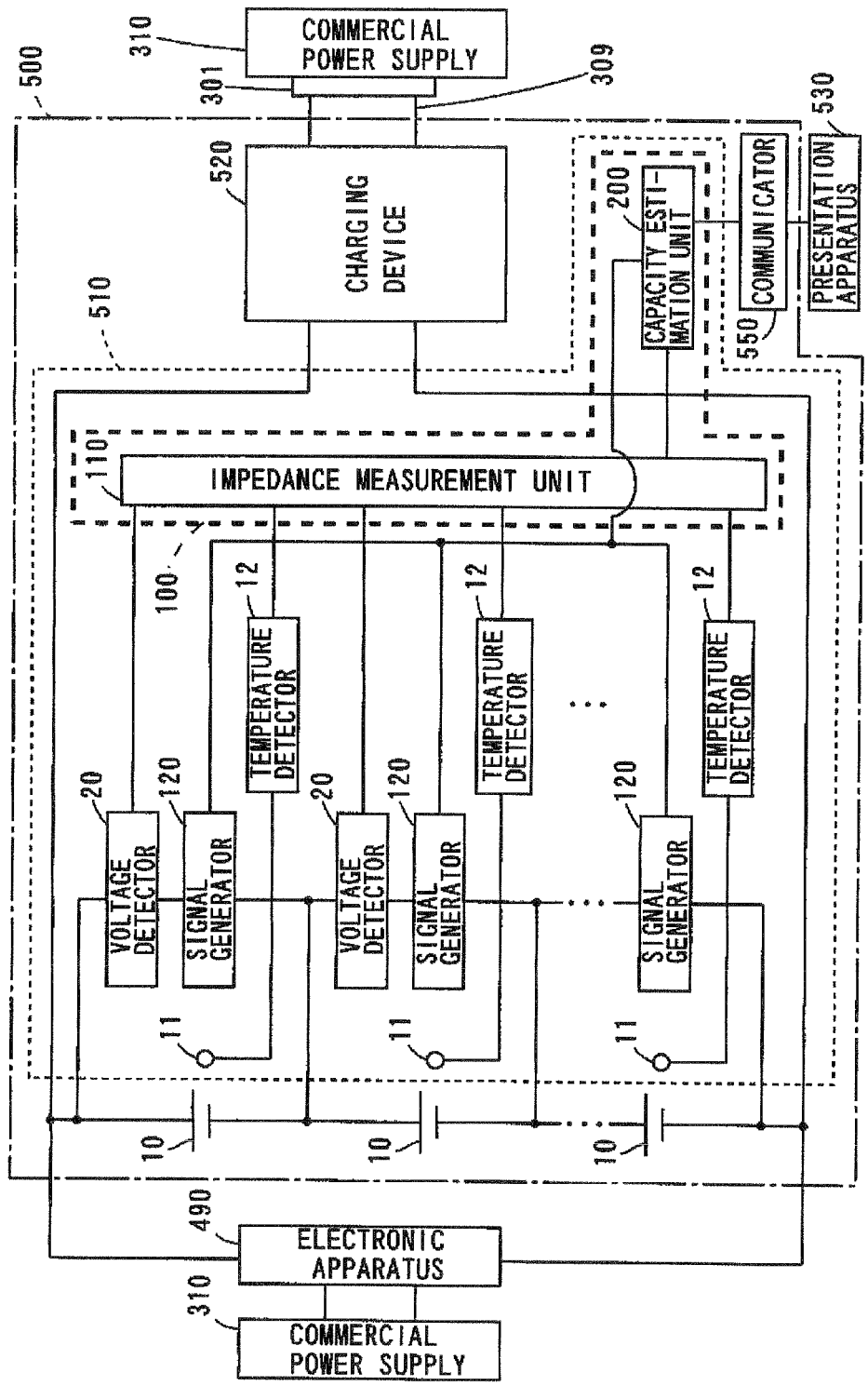
FIG. 21 is a block diagram of a backup power supply device including a battery system according to another example of the configuration.

FIG. 21 is a block diagram of a backup power supply device including a battery system 500 according to another example of the configuration. In this manner, the battery system 500 of this example including the plurality of signal generators 120 is also applicable to the backup power supply device.

(10) Correspondences between Elements in the Claims and Parts in Embodiments

In the following paragraph, non-limiting examples of correspondences between various elements recited in the claims below and those described above with respect to various preferred embodiments of the present invention are explained.

In the above-described embodiments, the impedance measurement unit 110 is an example of an impedance calculator, the feature frequency is an example of feature information about a frequency in the claims, and the temperature-frequency-capacity maintenance ratio table is an example of a correspondence relationship among a temperature of a battery, a value of the feature information and a capacity maintenance ratio. The feature frequency ratio is an example of a feature information ratio, the temperature-reference frequency table is an example of a first correspondence relationship, the frequency ratio-capacity maintenance ratio table is an example of a second correspondence relationship, and the presentation apparatus 530 and the communicator 550 are examples of an output apparatus.

The capacity maintenance ratio is a ratio of a present capacity to a reference capacity, which is, for example, a value obtained by dividing the present capacity by the reference capacity, the full charge capacity in the initial charge/discharge cycle for calculating the capacity maintenance ratio is an example of a reference capacity, and the full charge capacity in an n-th charge/discharge cycle is an example of the present capacity. When the initial charge/discharge cycle is the first charge/discharge cycle, n is a natural number of not less than two. As described above, the initial charge/discharge cycle means a charge/discharge cycle at the predetermined timing. The initial charge/discharge cycle may be the first charge/discharge cycle immediately after the battery 10 is manufactured, or may be the first charge/discharge cycle after shipment from a factory, for example.

As each of various elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

I claim:

1. A capacity maintenance ratio determination device that determines a capacity maintenance ratio, which is a ratio of a present capacity to a reference capacity, of a chargeable and dischargeable battery based on a response signal output from said battery in response to an alternating signal having a plurality of frequency components applied from a signal generator and based on a temperature of said battery detected by a temperature detector, comprising:

an impedance calculator arranged to calculate frequency characteristics of AC impedance of said battery based on said response signal output from said battery;

a storage arranged to store a relationship between a value of predetermined feature information about a frequency in the frequency characteristics of the AC impedance and the capacity maintenance ratio; and a determiner arranged to determine the value of the feature information in the frequency characteristics calculated by said impedance calculator, and determine the capacity maintenance ratio corresponding to said determined value of the feature information based on the relationship stored in said storage and the temperature detected by said temperature detector.

2. The capacity maintenance ratio determination device according to claim 1, wherein said frequency characteristics of the AC impedance is imaginary axis component-real axis component characteristics of complex impedance for each frequency, and when there is one maximal value of an imaginary axis component in said imaginary axis component-real axis component characteristics, said feature information is a frequency corresponding to the one maximal value, and when there are two maximal values of the imaginary axis component in said imaginary axis component-real axis component characteristics, said feature information is a frequency corresponding to a larger one of the two maximal values.

3. The capacity maintenance ratio determination device according to claim 1, wherein said battery is represented by an equivalent circuit including one parallel circuit or an equivalent circuit including two parallel circuits connected in series, and each parallel circuit includes parallel connection of a capacitance component and a resistance component, said frequency characteristics of the AC impedance are a relationship between a capacitance value and a resistance value for each frequency of said one or two parallel circuits obtained from imaginary axis component-real axis component characteristics of complex impedance for each frequency, and when said battery is represented by the equivalent circuit including the one parallel circuit, said feature information is a frequency calculated based on a product of a capacitance value and a resistance value of the one parallel circuit, and when said battery is represented by the equivalent circuit including the two parallel circuits, said feature information is a smaller one of frequencies calculated based on respective products of capacitance values and resistance values of the two parallel circuits.

4. The capacity maintenance ratio determination device according to claim 1, wherein said frequency characteristics of the AC impedance is an imaginary axis component-frequency characteristics of complex impedance for each frequency, and when there is one maximal value of an imaginary axis component in said imaginary axis component-frequency characteristics, said feature information is a frequency corresponding to the one maximal value, and when there are two maximal values of the imaginary axis component in said imaginary axis component-frequency characteristics, said feature information is a frequency corresponding to a maximal value on a lower frequency side of the two maximal values.

5. The capacity maintenance ratio determination device according to claim 1, wherein said storage is arranged to store a correspondence relationship among the temperature of said battery, said value of the feature information and the capacity maintenance ratio, and said determiner is arranged to determine the capacity maintenance ratio corresponding to the temperature detected by said temperature detector and said determined value of the feature information using said correspondence relationship stored in said storage.

6. The capacity maintenance ratio determination device according to claim 1, wherein when a value of the feature information in a reference capacity maintenance ratio is a reference feature information value and a ratio of each value of the feature information to the reference feature information value is a feature information ratio, said storage is arranged to store a correspondence relationship between the temperature of said battery and the reference feature information value as a first correspondence relationship, and store a correspondence relationship between the feature information ratio and the capacity maintenance ratio as a second correspondence relationship, and said determiner is arranged to find the reference feature information value corresponding to the temperature detected by said temperature detector using said first correspondence relationship stored in said storage, find the feature information ratio from said determined value of the feature information and said found reference feature information value, and determine the capacity maintenance ratio corresponding to said found feature information ratio using said second correspondence relationship.

7. The capacity maintenance ratio determination device according to claim 1, wherein when a value of the feature information in a reference temperature of said battery and a reference capacity maintenance ratio is a reference feature information value and a ratio of each value of the feature information to the reference feature information value is a feature information ratio, the storage is arranged to store the reference feature information value and store a correspondence relationship between the feature information ratio and the capacity maintenance ratio, and said determiner is arranged to correct said reference feature information value stored in said storage based on the temperature detected by said temperature detector, find the feature information ratio from said determined value of the feature information and the corrected reference feature information value, and determine the capacity maintenance ratio corresponding to said found feature information ratio using said correspondence relationship stored in said storage.

8. A battery system comprising:

a chargeable and dischargeable battery;

a signal generator arranged to apply an alternating signal having a plurality of frequency components to said battery;

an impedance calculator arranged to calculate frequency characteristics of AC impedance based on a response signal output from said battery in response to said alternating signal;

a storage arranged to store a relationship between a value of predetermined feature information about a frequency in the frequency characteristics of the AC impedance and a capacity maintenance ratio;

a temperature detector arranged to detect a temperature of said battery;

a determiner arranged to determine the value of the feature information in the frequency characteristics calculated by said impedance calculator, and determine the capacity maintenance ratio corresponding to said determined value of the feature information based on the relationship stored in said storage and the temperature detected by said temperature detector; and a communicator for communicating information about the capacity maintenance ratio determined by said determiner.

9. An electric vehicle comprising:

the battery system according to the claim 8;

a motor driven by electric power supplied from the battery of said battery system;

a drive wheel rotated by torque of said motor; and an output apparatus arranged to output the information about the capacity maintenance ratio determined by the determiner of said battery system.

* * * * *